United States Patent [19]
Ohkawa

[11] Patent Number: 6,091,154
[45] Date of Patent: Jul. 18, 2000

[54] SEMICONDUCTOR DEVICE WITH SELF-ALIGNED CONTACT AND MANUFACTURING METHOD THEREOF

[75] Inventor: Narumi Ohkawa, Kawasaki, Japan

[73] Assignee: Fujitsu Limited, Kawasaki, Japan

[21] Appl. No.: 09/013,699

[22] Filed: Jan. 26, 1998

[30] Foreign Application Priority Data

Mar. 19, 1997 [JP] Japan ................................. 9-066898
Sep. 25, 1997 [JP] Japan ................................. 9-260443

[51] Int. Cl.$^7$ ........................... H01L 23/48; H01L 23/52; H01L 29/40
[52] U.S. Cl. ....................... 257/774; 257/758; 257/382; 438/637; 438/675
[58] Field of Search ................................ 257/758, 249, 257/296, 343, 365, 377, 382, 388, 412, 751, 750, 774; 438/180, 253, 229, 233, 637, 675

[56] References Cited

U.S. PATENT DOCUMENTS

| | | | |
|---|---|---|---|
| 5,292,677 | 3/1994 | Dennison | 438/396 |
| 5,432,381 | 7/1995 | Melzner | 257/774 |
| 5,498,889 | 3/1996 | Hayden | 257/301 |
| 5,612,240 | 3/1997 | Chang | 438/297 |
| 5,679,981 | 10/1997 | Kuwajima | 257/752 |

*Primary Examiner*—Olik Chaudhuri
*Assistant Examiner*—Phat X. Cao
*Attorney, Agent, or Firm*—Armstrong, Westerman, Hattori, McLeland & Naughton

[57] ABSTRACT

A semiconductor device formed on a semiconductor substrate having a first region and a second region, comprising: a wiring layer made of a first conductive layer formed in the second region; a first insulating film formed on the wiring layer; a second insulating film formed on the first region and on the first insulating film; a first contact hole formed in the first region through the second insulating film, and reaching the surface of the first insulating film; a second contact hole having a larger diameter than the first contact hole formed in the second region through the second insulating film, and reaching the surface of the first insulating film; a plug made of a second conductive layer and filled in the first contact hole; a side spacer made of the second conductive layer and formed on the side wall of the second contact hole; and a third contact hole having a smaller diameter than the second contact hole, formed through the first insulating film positioned under the second contact hole, and reaching the wiring layer. There are provided the semiconductor device and its manufacture method which are capable of stably realizing a self-aligned contact method of forming contact holes, without increasing the number of manufacture processes.

14 Claims, 33 Drawing Sheets

SEMICONDUCTOR DEVICE WITH SELF-ALIGNED CONTACT AND MANUFACTURING METHOD THEREOF

This application is based on Japanese Patent Applications No. 9-66898 filed on Mar. 19, 1997 and No. 9-260443 filed on Sep. 25, 1997, the entire contents of which are incorporated herein by reference.

BACKGROUND OF THE INVENTION a) Field of the Invention

The present invention relates to a semiconductor device and its manufacture method, and more particularly to a semiconductor device with self-aligned contacts and its manufacture method.

b) Description of the Related Art

In order to achieve high integration and low cost of semiconductor devices, it is necessary to form basic constituents or semiconductor elements as small as possible. In order to make a fine semiconductor element, it is necessary to make a position alignment margin as small as possible which is provided for preventing electrical short or the like between wiring patterns when a contact hole is formed.

A method called self aligned contact (SAC) is known as a method of forming a fine contact hole. This method is disclosed, for example, in JP-A-58-115859.

With this method, after a first insulating film is formed on the gate electrode layer of a MOS transistor, the gate electrode layer is patterned to form a gate electrode. Then, source/drain diffusion regions are formed and thereafter a second insulating film is formed over the whole surface of the substrate. The second insulating film is anisotropically etched to expose the surfaces of the diffusion regions.

With the above processes, the side walls of the gate electrode structure including the first insulating film are covered with the second insulating film. The periphery of the gate electrode can therefore be insulated completely by the first and second insulating films. When a third insulating film having different etching characteristics from the first and second insulating films is formed over the whole surface of the substrate, contact holes can be formed to the diffusion regions in a self-aligned manner.

If a contact window is formed by such a SAC method, a position alignment margin between the underlying conductive layer and a contact hole is not necessary and the cell can be made finer correspondingly.

An example of improved self-aligned contact techniques used for forming a dynamic random access memory (DRAM) cell will be described with reference to the cross sectional views of FIGS. 15A to 15D which illustrate the main manufacture processes thereof.

FIGS. 15A to 15D are cross sectional views showing a typical memory cell portion taken along the direction crossing the word line extending direction. With reference to these Figures, a specific description will be given for a method of forming contact holes to a bit line, a storage electrode and the source/drain diffusion regions of a MOS transistor by using self-aligned contact techniques. First, as shown in FIG. 15A, a gate insulating film 113 is formed on the active region of a silicon substrate 111 defined by a field oxide film 112 made by local oxidation of silicon (LOCOS). On this gate insulating film 113, a polycide gate electrode is formed which is constituted of a polysilicon layer 114 and a tungsten silicide layer 115. By using the gate electrode and LOCOS oxide film as a mask, impurity ions are implanted to form source/drain diffusion regions 116. Next, a nitride film 117 is formed covering the periphery of the polycide gate electrode which corresponds to a word line.

The processes up to this are the same as the above-described self-aligned contact method, and may be performed by the method described in the above-cited JP-A-58-115859.

Next, a silicon oxide film 118 is formed over the whole surface of the substrate. This silicon oxide film is planarized by chemical mechanical polishing (CMP) or the like in order to facilitate later processes.

Next, as shown in FIG. 15B, resist is coated on the planarized oxide film 118 and patterned by usual photolithography to form a resist pattern 119 which is used later as an etching mask.

Next, as shown in FIG. 15C, by using the resist pattern as a mask, the oxide film 118 is etched to form contact holes 120 reaching the diffusion regions 116. The etching conditions are set so as to have a large etching selection ratio of the oxide film relative to the silicon nitride film. Therefore, when the nitride film 117 is exposed while the oxide film is etched, this nitride film is hardly etched. The etching can be stopped automatically at the nitride film 117 so that the contact holes can be formed in a self-aligned manner and have generally the same area as initially defined by the nitride film.

The resist pattern is thereafter removed by known techniques.

Next, as shown in FIG. 15D, a conductive layer 121 is formed in the contact holes.

Even if the contact holes are formed overlapping the upper portion or its nearby portion of the gate electrode structure because of a position misalignment of the resist pattern 119, electrical short will not occur between the conductive layer 121 and the polycide gate electrode. It is not necessary therefore to provide a position alignment margin of the contact holes relative to the polycide electrode.

The above techniques therefore allow to planarize the oxide film 118 as an interlayer insulating film and to form contact holes in a self-aligned manner.

Such a conventional self-aligned contact method is associated, however, with the following problems because of a multi-layer process used for highly integrated semiconductor devices.

There is a great need for reducing the number of processes, for example, by forming wiring layers of the same level at the same time in both a memory cell portion and a peripheral circuit portion or forming contact holes to conductive layers of different levels at the same time in both the portions by the same process.

The problems of conventional techniques will be described more specifically with reference to FIGS. 16A to 16C and FIGS. 17A to 17C.

A first example will be described with reference to FIGS. 16A to 16C.

As shown in FIG. 16A, a gate insulating film 113 is formed on a silicon substrate 111. In the memory cell portion, a polycide gate electrode 115 made of polysilicon and tungsten silicide is formed on the gate insulating film 113. In the peripheral circuit portion, a first wiring layer 115a is formed having the same structure as the polycide gate electrode.

A nitride film 117a is formed on both the polycide gate electrode 115 and first wiring layer 115a. By using at least the polycide gate electrode 115 as a mask, impurities are doped into the silicon substrate 111 to form source/drain diffusion regions (not shown).

Next, as shown in FIG. 16B, spacers made of nitride are formed on the side walls of the polycide gate electrode 115 and first wiring layer 115a to thereby form a nitride film 117 which covers the outer surfaces of the polycide gate electrode 115 and first wiring layer 115a. This polycide gate electrode corresponds to a word line.

Next, a silicon oxide film 118 is formed over the whole surface of the substrate. This silicon oxide film is planarized by CMP or the like in order to facilitate later processes.

Next, as shown in FIG. 16C, resist is coated on the planarized oxide film 118 and patterned by usual photolithography to form a resist pattern 119.

By using the resist pattern 119 as a mask, the silicon oxide film 118 is etched to form a contact hole 120a reaching the source/drain diffusion region (not shown) and a contact hole 120b reaching the nitride film 117 on the first wiring layer 115a. The etching conditions are set so as to have a large etching selection ratio of the silicon oxide film to the silicon nitride film.

The processes up to this are conventional techniques using self-aligned contact. Since the nitride film 117 on the first wiring layer 115a is hardly etched, it is not possible to form both the contact holes to the source/drain diffusion region and first wiring layer by a single process.

In order to electrically connect the same wiring layer to both the source/drain diffusion region and first wiring layer in contact holes, the nitride film 117 on the first wiring layer 115a is required to be etched. Therefore, it is necessary to perform photolithography once more, lowering the manufacture yield.

A second example will be described with reference to FIGS. 17A to 17C.

As shown in FIG. 17A, a gate insulating film 113 is formed on a silicon substrate 111. In the memory cell portion, a polycide gate electrode 115 made of polysilicon and tungsten silicide is formed on the gate insulating film 113. In the peripheral circuit portion, a first wiring layer 115a is formed having the same structure as the polycide gate electrode. By using at least the polycide gate electrode 115 as a mask, impurities are doped into the silicon substrate 111 to form source/drain diffusion regions (not shown). Both the polycide gate electrode 115 and first wiring layer 115a are covered with an oxide film 127. The polycide gate electrode corresponds to a word line.

Next, as shown in FIG. 17B, a silicon oxide film 137 and a nitride film 147 are sequentially formed. Then, another silicon oxide film 118 is formed over the whole surface of the substrate. This silicon oxide film 118 is planarized by CMP or the like in order to facilitate later processes.

Next, as shown in FIG. 17C, by using a resist pattern (not shown) as a mask, the silicon oxide film 118 is etched to form a contact hole 120a reaching the source/drain diffusion region (not shown) and a contact hole 120b reaching the silicon oxide film 127 on the first wiring layer 115a.

In this case, in etching the contact holes, the silicon oxide film 118 is etched at the first stage at a large etching ratio of the silicon oxide film to the nitride film. At the second stage the nitride film 147 is etched at a large etching ratio of the nitride film to the silicon oxide film. At the third stage, the silicon oxide film 137 is etched. With this method, the contact hole 120a can be formed in a self-aligned manner relative to the polycide gate electrode 115.

The processes up to this are conventional techniques using self-aligned contact. Also in this second example, the problem same as described in the first example occurs.

Specifically, since the oxide film 127 on the first wiring layer 115a is hardly etched, it is not possible to form both the contact holes to the source/drain diffusion region and first wiring layer by a single process.

The two self-aligned contact methods of the first and second examples are characterized in the formation of a nitride film on the polycide gate electrode. By using this nitride film as a stopper of etching the silicon oxide film, contact holes are formed in a self-aligned manner.

In order to electrically connect the same wiring layer to both the source/drain diffusion region and first wiring layer through contact holes, by using the above-described contact hole etching methods, it is necessary to form a contact hole to the first wiring layer through another photolithography different from that used for forming a contact hole to the source/drain diffusion regions. This increases the number of processes.

Low cost of semiconductor device manufacture processes is an important technical issue. If a single patterning process in particular can be omitted, a series of resist coating, exposure and development processes can be all omitted. Therefore, this patterning process is very important.

SUMMARY OF THE INVENTION

It is an object of the present invention to provide a semiconductor device or its manufacture method capable of stably realizing a self-aligned contact method of forming contact holes without increasing the number of processes.

According to one aspect of the present invention, there is provided a semiconductor device formed on a semiconductor substrate having a first region and a second region, comprising: (a) a first wiring layer made of a first conductive layer formed in the second region of the semiconductor substrate; (b) a first insulating film covering the first wiring layer; (c) a second insulating film formed over the semiconductor substrate, covering the first insulating film; (d) a first contact hole formed through the second insulating film in the first region, the first contact hole having a first diameter and reaching the surface of the semiconductor substrate; (e) a second contact hole formed through the second insulating film in the second region, the second contact hole having a second diameter larger than the first diameter and reaching the surface of the first insulating film; (f) a first conductive plug made of a second conductive layer filled in the first contact hole; (g) a conductive side spacer made of the second conductive layer and formed on a side wall of the second contact hole; and (h) a third contact hole formed through the first insulating film positioned under the second contact hole, the third contact hole having a third diameter smaller than the second diameter and reaching the first wiring layer.

According to another aspect of the present invention, there is provided a method of manufacturing a semiconductor device formed on a semiconductor substrate having a first region and a second region, comprising the steps of: (a) sequentially laminating a first conductive layer and a first insulating film over the semiconductor substrate; (b) forming a first wiring layer in the second region by patterning the first insulating film and the first conductive layer; (c) forming a second insulating film over the semiconductor substrate, the second insulating film covering the first wiring layer; (d) forming a first contact hole in the first region by selectively etching the second insulating film, the first contact hole having a first diameter and reaching the surface of the semiconductor substrate, and forming a second contact hole in the second region by selectively etching the second insulating film, the second contact hole having a second diameter larger than the first diameter and exposing the surface of the first insulating film; (e) forming a first conductive plug made of a second conductive layer and filling the first contact hole and a conductive side spacer made of the second conductive layer on a side wall of the second contact hole and partially exposing the surface of the first insulating film; and (f) thereafter etching the partially exposed first insulating film by using the second insulating film, the first conductive plug and the conductive side spacer, as a mask, and forming a third contact hole exposing the first wiring layer.

The first and second contact holes are formed, the first contact hole having the first diameter and reaching the surface of the semiconductor substrate and the second contact hole having the second diameter larger than the first diameter and reaching the insulating film on the wiring layer. By utilizing a difference between the hole diameters, the plug can be formed in the first contact hole and the side spacer can be formed on the side wall of the second contact hole.

By using the plug and side spacer as a mask, the insulating film exposed under the side spacer is etched. It is therefore unnecessary to use a specific photomask for etching the insulating film and is possible to form a contact hole in a self-aligned manner which reaches the underlying wiring layer.

It is possible to form a plurality of fine contact holes by SAC without increasing the number of processes, greatly contributing to high performance and integration of semiconductor devices.

Contact holes such as a contact hole for a storage electrode can be formed in a self-aligned manner without damaging the substrate surface, by forming contact holes of different depths through an etching process whose position alignment precision is determined by a resist mask.

According to another aspect of the present invention, there is provided a semiconductor device comprising: (a) a semiconductor substrate having a first region and a second region; (b) a gate insulating film formed on the semiconductor substrate; (c) a plurality of first gate electrodes formed on the gate insulating film in the first region and a second gate electrode formed on the gate insulating film in the second region; (d) a first insulating film covering the first gate electrode and covering the top and side walls of the second gate electrode; (e) a second insulating film formed over the semiconductor substrate, the second insulating film covering the first insulating film and made of material having different etching characteristics from the first insulating film; (f) a first contact hole formed through the second insulating film in the first region, the first contact hole reaching the surface of the semiconductor substrate between an adjacent pair of first gate electrodes; (g) a second contact hole formed through the second insulating film and the first insulating film in the second region, the second contact hole reaching the surface of the second gate electrode; (h) a side spacer of insulating material formed on the side wall of the first and second contact holes; and (i) a third contact hole formed through the second insulating film in the first region and reaching the surface of the semiconductor substrate.

Electrical insulation between the bit contact wiring pattern and the gate electrode in the memory cell region can be obtained by a side spacer formed on the side wall of a contact hole. If the side spacer is made of an oxide film, the capacitance between the bit line and gate electrode can be reduced.

By adding one resist mask not requiring high precision, contact holes of different depths can be formed. Also in this case, damages to the substrate surface can be reduced.

DETAILED DESCRIPTION OF THE PREFERRED EMBODIMENTS

Embodiments of the invention will be described in detail with reference to the accompanying drawings, by taking DRAM as an example.

1st Embodiment

Figure 1:
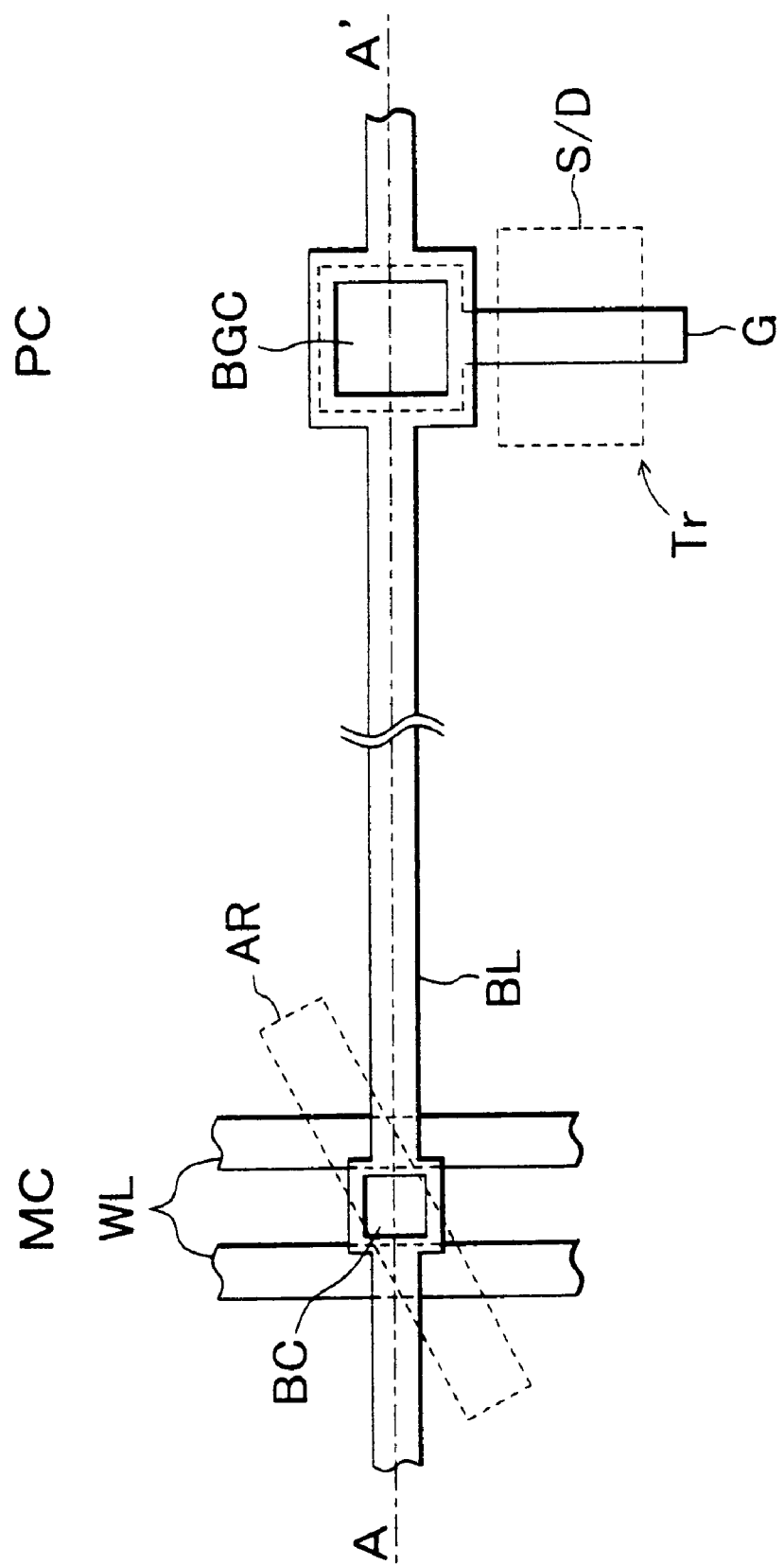
FIG. 1 is a plan view of a memory cell portion (MC) and a peripheral circuit portion (PC) of a semiconductor device according to first to eighth embodiments of the invention.
Figure 2A:
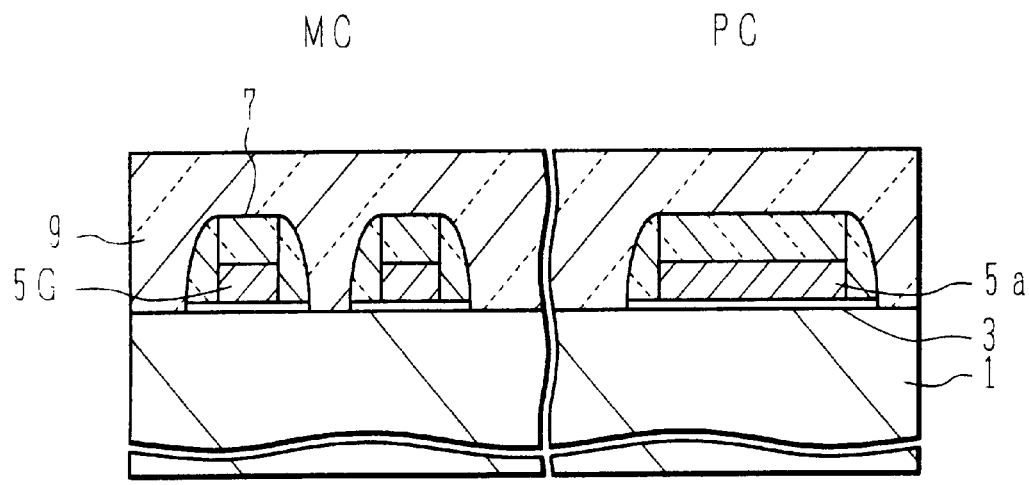
FIGS. 2A to 2E are cross sectional views of a semiconductor device in main manufacture processes illustrating the first embodiment of the invention.
Figure 2B:
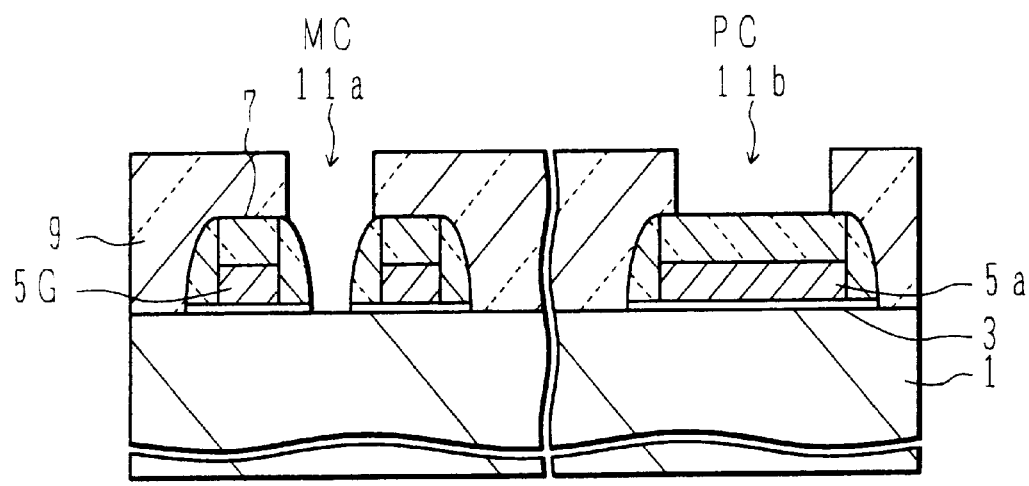
Figure 2C:
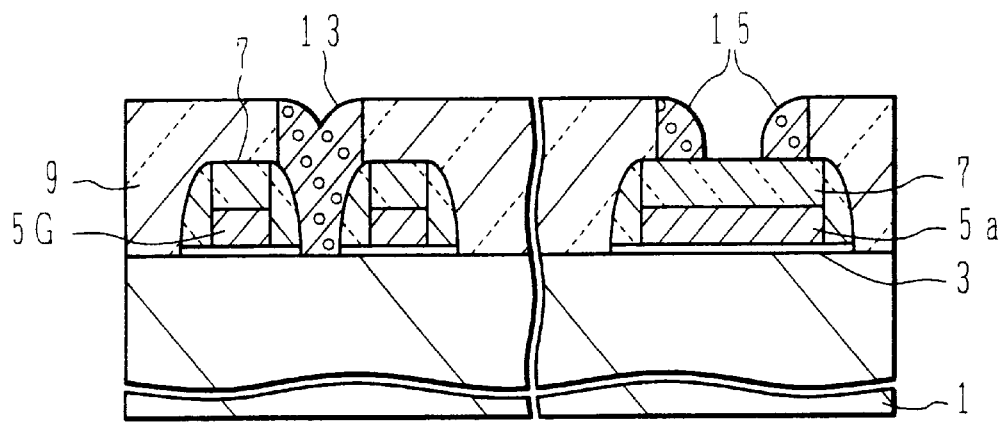
Figure 2D:
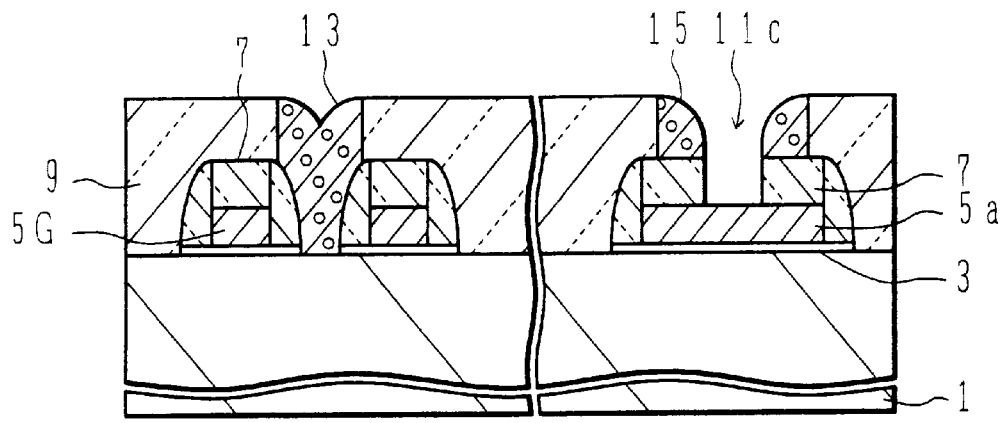
Figure 2E:
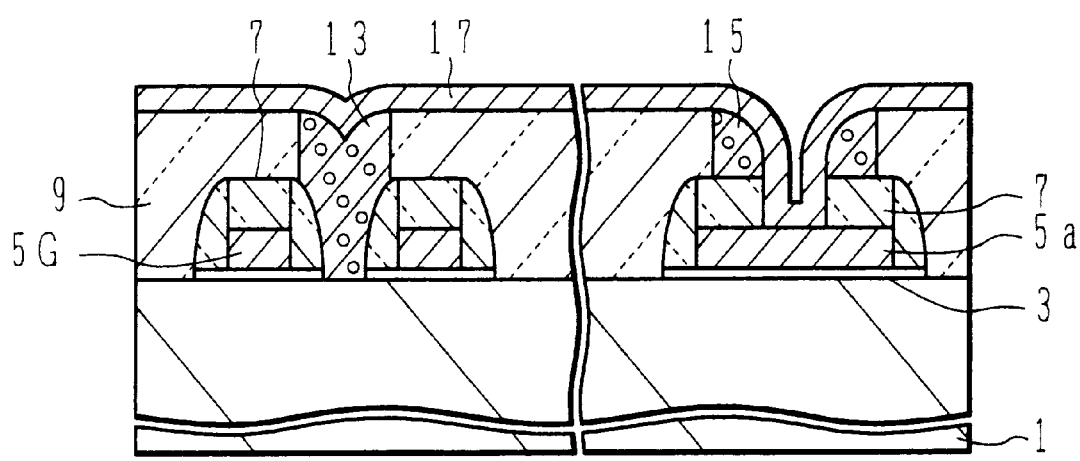

The first embodiment of the invention is illustrated in FIG. 1 to FIG. 2E.

FIG. 1 is a plan view of a memory cell portion MC and a peripheral circuit portion PC according to the first embodiment. A bit line BL extends in the horizontal direction in FIG. 1. In the memory cell portion MC, an active region AR obliquely crosses the bit line BL. A bit line contact BC is formed at this cross point. In the peripheral circuit portion PC, the bit line BL is connected via a bit/gate contact BGC to a gate electrode G between source/drain regions S/D.

FIGS. 2A to 2E are cross sectional views of a semiconductor device in main manufacture processes illustrating the first embodiment of the invention. The left side of each Figure shows the memory cell portion and the right side shows the peripheral circuit portion. These cross sectional views are taken along line A-A' of the plan view of FIG. 1.

In these Figures, reference numeral 1 represents a p-type silicon substrate, 3 represents a gate oxide film, 5 (5*a*) represents a gate electrode (a first wiring layer serving as a word line), 7 represents an SiN film, 9 represents a borophosphosilicate glass (BPSG) film, 11*a* and 11*b* represent a contact hole, 13 represents a plug, 15 represents a side wall, and 17 represents a bit line (a third wiring layer).

A semiconductor device manufacture method of the first embodiment will be described with reference to FIGS. 1 to 2E.

Reference is made to FIG. 2A. An $SiO_2$ (not shown) is formed 200 nm thick on a p-type silicon substrate 1 by known techniques of LOCOS.

Next, an $SiO_2$ film 3 serving as a gate oxide film is formed 5 to 8 nm thick by thermal oxidation in the active region defined by the field $SiO_2$ film.

Next, a doped silicon layer of 50 nm thick containing n- or p-type impurities at a high concentration, a WSi layer of 100 to 120 nm thick and an SiN film of 80 to 100 nm thick are sequentially formed over the whole surface of the substrate by chemical vapor deposition (CVD). The doped silicon layer may be polysilicon or amorphous silicon.

Next, by using a patterned resist mask (not shown), the SiN film is selectively etched by F containing etchant and the WSi and doped silicon layers are selectively etched by Cl containing etchant to thereby form a gate electrode 5G (a second wiring layer) in the memory cell portion and a first wiring layer 5*a* in the peripheral circuit portion. The gate electrode 5G serves as the word line. The SiN layer is stacked on the wiring layers 5G and 5*a*. In the following, the wiring layers 5G and 5*a* are collectively described as the wiring layer 5, where applicable.

Next, by using the gate electrode 5G as a mask, P (phosphorous) ions are implanted into the silicon substrate 1 to form n-type impurity diffusion regions (not shown). The n-type impurity diffusion regions are used as the source and drain regions (not shown) of a transfer transistor in the memory cell portion and as lightly doped drain (LDD) diffusion regions (not shown) of an n-channel transistor in the peripheral circuit portion.

Next, an SiN film is formed 50 to 100 nm thick, preferably 80 nm thick, on the substrate whole surface by low pressure CVD and anisotropically etched to form side walls made of the SiN film 7 which covers the gate electrode 5G together with the SiN layer formed at the top of the gate electrode. This SiN film 7 serves as a stopper film when a BPSG film 9 formed next is removed.

Next, the BPSG film 9 is formed 300 to 400 nm thick over the substrate whole surface and reflowed by heat treatment at about 800° C. in a nitrogen atmosphere to planarize it. In order to planarize this film perfectly, it is preferable to use chemical mechanical polishing (CMP) to polish the surface of the BPSG film 9.

The BPSG film may be replaced by a phosphosilicate glass (PSG) film, a silicon on glass (SOG) film, an insulating resin film or the like.

Reference is made to FIG. 2B. By using a patterned resist mask (not shown), the BPSG film 9 is selectively etched to form a contact hole 11*a* to the substrate between the gate electrodes 5G and a contact hole 11*b* to the first wiring layer 5*a*, by a self-aligned contact (SAC) method. It is preferable to set the diameter of the contact hole 11*b* to about 0.45 μm if the diameter of the contact hole 11*a* is set to about 0.15 μm.

At this stage, the contact hole 11*a* to the substrate is formed in a self-aligned manner relative to the gate electrode 5G and reaches the substrate, whereas the contact hole 11*b* to the first wiring layer 5*a* stops at the SiN film 7.

At this stage the contact hole 11*b* opens on the SiN film 7 and does not provide electrical contact as yet. The contact hole 11*b* provides electrical contact when the SiN film 7 is later etched in a self-aligned manner and a contact hole 11*c* is formed. For convenience, this hole 11*b* is also called a contact hole although it provides no electrical contact at this stage.

Reference is made to FIG. 2C. A doped silicon layer is formed 100 nm thick by low pressure CVD. The doped silicon layer is filled in the narrow contact hole 11*a*, but it is not completely filled in the broad contact hole 11*b* to the first wiring layer. In other words, the thickness of the doped silicon layer is so determined that although it is filled in the contact hole 11*a*, it is not completely filled in the contact hole 11*b*. The surface of the silicon substrate exposed in the contact hole 11*a* is completely covered with the doped silicon layer.

Next, the doped silicon layer on the planarized surface of the BPSG film 9 is removed by anisotropic etching to form a plug 13 in the contact hole 11*a* to the substrate and a side wall 15 in the contact hole 11*b* to the first wiring.

The doped silicon layer may be replaced by another conductive or metal layer such as W and TiN to form the plug 13 and side wall 15.

Reference is made to FIG. 2D. By using the BPSG film 9, plug 13 and side wall 15 as a mask, the SiN film 7 on the first wiring layer 5*a* is dry-etched by using $CF_4$ containing etching gas or the like to thereby form a contact hole 11*c* reaching the first wiring layer in a self-aligned manner.

Reference is made to FIG. 2E. A doped silicon layer of 30 nm thick and a WSi layer of 70 nm thick are sequentially formed over the substrate whole surface by low pressure CVD. By using a patterned resist mask (not shown), these layers are selectively removed to form a bit line 17 as a third wiring layer.

Thereafter, an interlayer insulating film, a capacitor, and a wiring layer are formed as necessary to complete a DRAM manufacture.

In this embodiment, the contact hole 11*a* to the silicon substrate 1 and the contact hole 11*b* to the first wiring layer 5*a* are made to have different hole diameters so that the plug 13 is formed in the contact hole 11a and the side wall 15 is formed in the contact hole 11b. The contact hole 11c is then formed in the contact hole 11b in a self-aligned manner relative to the side wall 15. Therefore, both the contact hole to the silicon substrate and the contact hole to the first wiring layer can be formed by using a single photomask.

An additional photolithography process is not necessary when the contact hole to the first wiring layer is formed in the peripheral circuit portion. Fine patterning through SAC can therefore be achieved.

2nd Embodiment

In the first embodiment, after the substrate contact in the memory cell portion and the contact reaching the first wiring layer are formed by using a single mask, the third wiring layer is formed in the contact hole to the first wiring layer. The layer filled in the contact hole to the first wiring layer is not limited to a wiring layer, but a plug may be filled in this contact hole.

Figure 3:
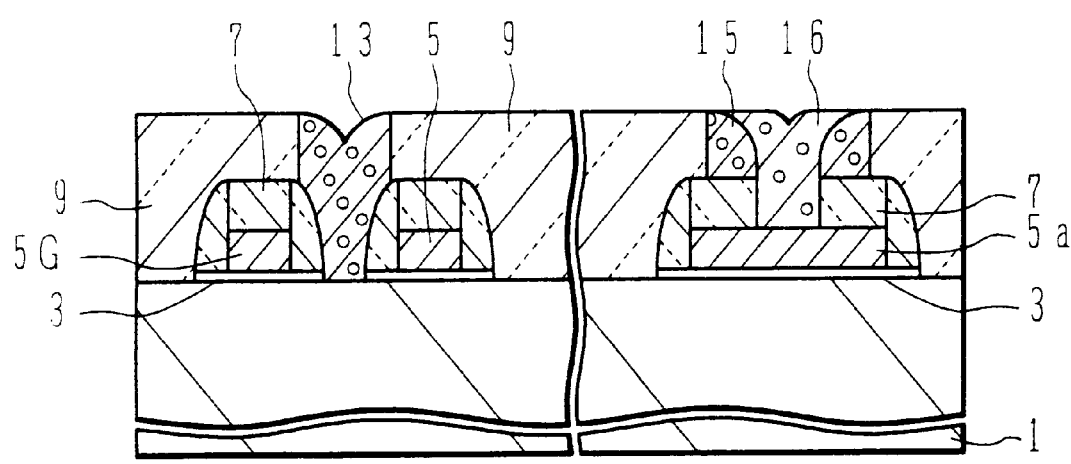
FIG. 3 is a cross sectional view of a semiconductor device according to the second embodiment of the invention.

The second embodiment will be described in detail with reference to the relevant Figures. The second embodiment is illustrated in FIG. 3. The description of second embodiment processes corresponding to FIGS. 1 to FIG. 2E is omitted. In FIG. 3, identical reference numerals to those shown in FIGS. 1 to 2E indicate like elements.

FIG. 3 is a cross sectional view of a semiconductor device according to the second embodiment of the invention, and corresponds to a cross sectional view taken along line A-A' of FIG. 1.

Reference is made to FIG. 3. By using techniques similar to those described with FIGS. 2A to 2E, a gate oxide film 3, a gate electrode 5G (a second wiring layer serving as a word line), a first wiring layer 5a, an SiN film 7, a BPSG film 9, contact holes 11a and 11b, a first plug 13 and a side wall 15 are formed on a p-type silicon substrate 1.

In the second embodiment, the diameter of the contact hole 11a is set to 0.15 μm, the diameter of the contact hole 11b is set to 0.30 μm, and the thickness of a doped silicon layer used for forming the plug 13 and side wall 15 is set to 100 nm.

Next, as illustrated in FIG. 2D, the-SiN film 7 is etched in a self-aligned manner to form the contact hole 11c to the first wiring layer. The diameter of the contact hole 11c is about 0.14 μm. The diameter of the contact hole 11c depends upon coverage of the doped silicon film used for forming the side wall and upon the etching conditions of the doped silicon layer.

Specifically, although it is generally expected that a spacer of 100 nm thick is formed if a layer of 100 nm thick is formed on the side wall of the hole having a diameter of 0.30 μm thick, this spacer has a film thickness of 80 nm because of poor coverage at the side wall and some over-etch of the etching conditions and the like.

In order to have a thickness of 80 nm of the side wall 15, the diameter of the contact hole 11c is therefore set to about 0.14 82 m as described above.

Thereafter, a doped silicon layer of 70 to 100 nm is formed and etched back or subjected to CMP to thereby form a second plug 16 also in the contact hole 11c reaching the first wiring layer.

The second plug may be made of a single layer of TiN, W or the like or a combination thereof.

In the second embodiment, the contact hole to the substrate and the contact hole to the first wiring layer are formed by using a single mask, and by making small the diameter of the contact hole 11b to the first wiring layer or thickening the conductive layer used for forming the second plug, the second plug 16 reaching the first wiring layer can be formed in the contact hole.

Therefore, the second wiring layer to be formed later is always formed on a flat surface. Accordingly, breakage of a wiring at a step portion can be prevented, photolithography can be performed at high precision, and reliability of a wiring can be increased.

Since the first and second plugs may be made of conductive layers of different materials, the degree of freedom of process designs can be increased.

3rd Embodiment

Next, the third embodiment will be described with reference to the relevant Figures.

In the first embodiment, by using the BPSG film 9, plug 13 and side wall 15 as a mask, the SiN film on the first wiring layer is etched to form the contact hole 11c reaching the first wiring layer. If it is difficult to provide a sufficient etching ratio of the SiN film to the BPSG film, plug and side wall, the BPSG film is greatly over-etched and the BPSG film may not have an expected thickness.

In the third embodiment, a semiconductor device and its manufacture method will be described which method facilitates to etch the SiN film when a contact hole 11c reaching the first wiring layer is formed.

FIGS. 4A to 4E are cross sectional views of a semiconductor device in main manufacture processes illustrating the third embodiment of the invention, and correspond to the cross section taken along line A-A' of the plan view of FIG. 1 described with the first embodiment. In FIGS. 4A to 4E, reference numeral 10 represents a doped silicon layer, and other reference numerals represent identical elements to those shown in FIGS. 2A to 2E described with the first embodiment.

Figure 4A:
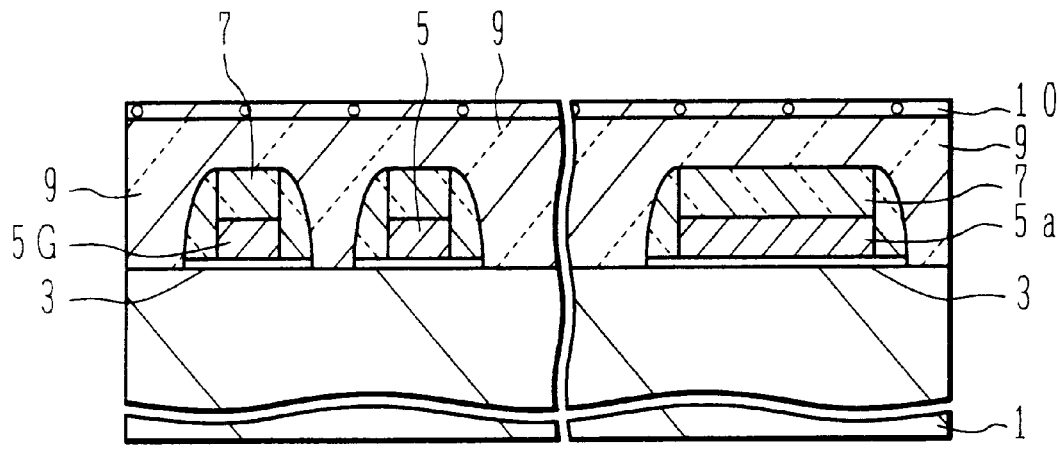
FIGS. 4A to 4E are cross sectional views of a semiconductor device in main manufacture processes illustrating the third embodiment of the invention.

Reference is made to FIG. 4A. After the process shown in FIG. 2A, a doped silicon layer 10 of 30 to 70 nm is formed by low pressure CVD.

Figure 4B:
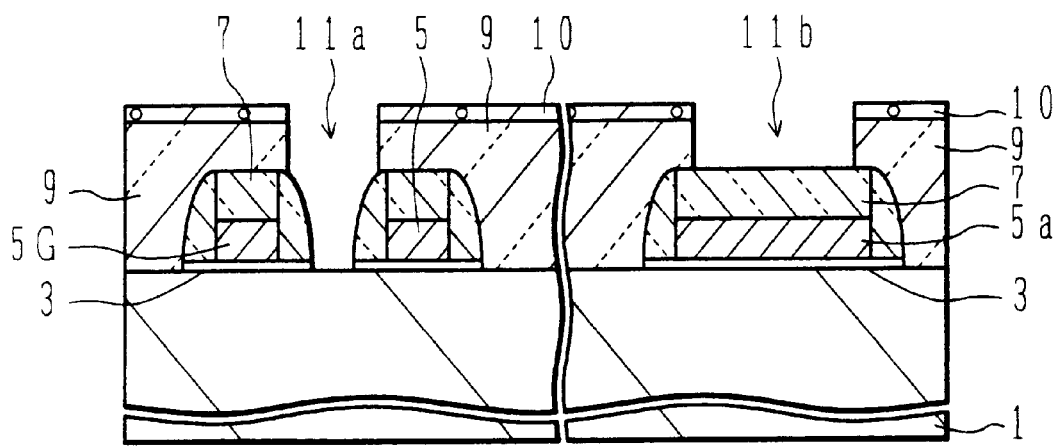

Reference is made to FIG. 4B. By using a patterned resist mask (not shown), the doped silicon layer 10 and BPSG film 9 are selectively etched to form a contact hole 11a to the substrate and a contact hole 11b to the first wiring layer through SAC. In this case, it is preferable to set the diameter of the contact hole 11b to about 0.45 μm if the diameter of the contact hole 11a is set to about 0.15 μm.

At this stage, the contact hole 11a to the substrate is formed in a self-aligned manner relative to the gate electrode 5G and reaches the substrate, whereas the contact hole 11b to the first wiring layer stops at the SiN film 7.

Figure 4C:
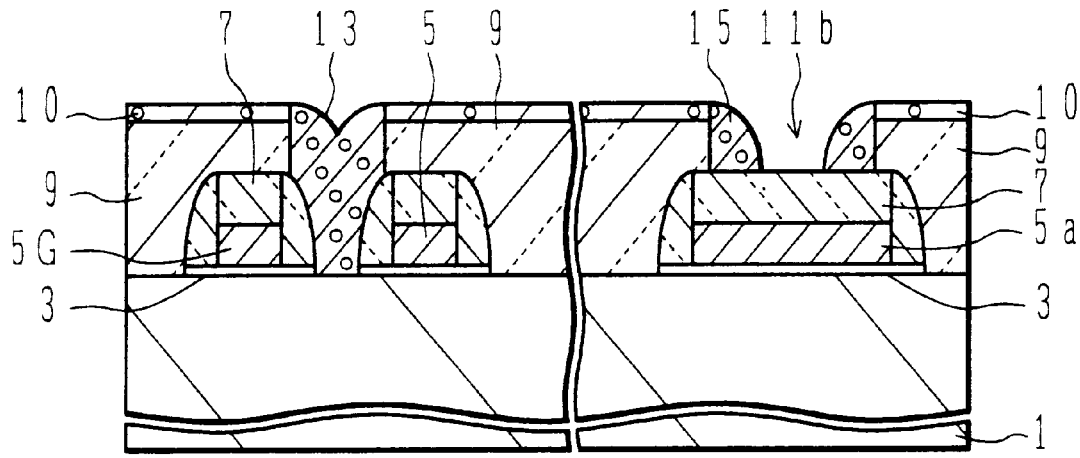

Reference is made to FIG. 4C, by using the process same as that of the first embodiment described with FIG. 2C, a plug 13 and a side wall 15 are formed. The areas other than the area where the SiN layer 7 is exposed, are covered with the doped silicon layer 10, and with the plug 13 and side wall 15 made of doped silicon.

Figure 4D:
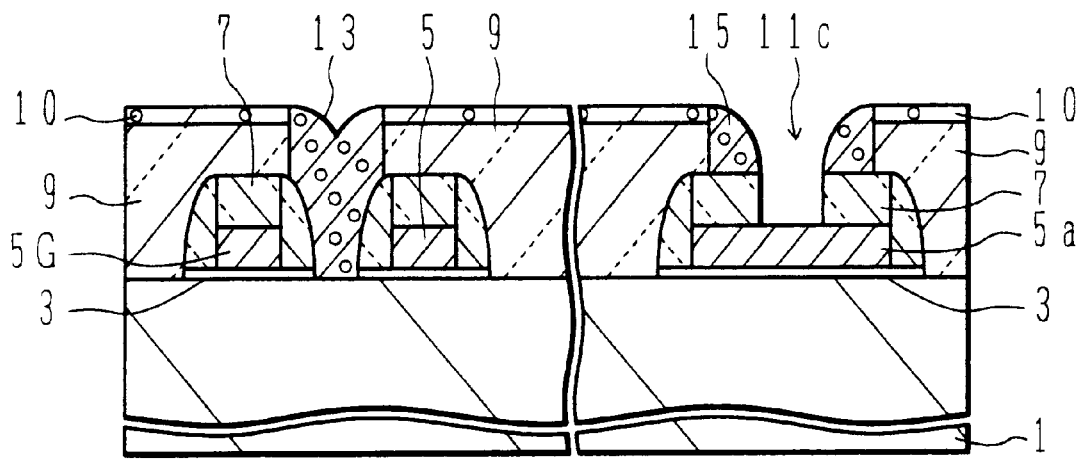

Reference is made to FIG. 4D. By using as a mask the doped silicon layer 10, plug 13 and side wall 15, the SiN film 7 on the first wiring layer is etched and removed to thereby form a contact hole 11c reaching the first wiring layer in a self-aligned manner.

If dry etching using a mixed gas of $CF_4$ and Ar is performed, a sufficient etching selection ratio of Si to SiN can be attained so that thinning of the BPSG film 9 as an interlayer insulating film can be prevented perfectly.

Figure 4E:
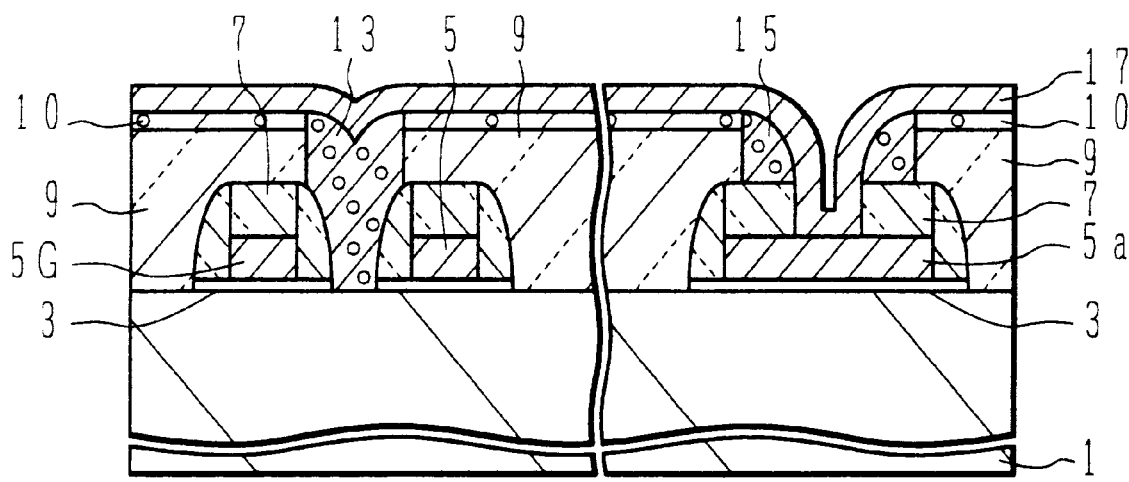

Reference is made to FIG. 4E. A doped silicon layer of 30 nm thick and a WSi layer of 70 nm thick are sequentially formed over the substrate whole surface by low pressure CVD. Next, by using a patterned resist mask (not shown), these layers are selectively removed to form a bit line 17 as a third wiring layer. In this case, the doped silicon layer 10 under the bit line 17 is also patterned.

Thereafter, an interlayer insulating film, a capacitor and a wiring layer are formed as necessary to complete a DRAM manufacture.

In this embodiment, the doped silicon layer which forms the doped silicon layer 10, plug 13 and side wall 15 is formed on the BPSG film 9. Therefore, for the etching of forming the contact hole 11c reaching the first wiring layer 5a, only a selection ratio of doped silicon to SiN is taken into consideration, facilitating the etching process. As the doped silicon layer 10, another layer of different material may be formed having the etching characteristics substantially the same as the plug 13 and side wall 15 and different from SiN.

4th Embodiment

Next, the fourth embodiment will be described with reference to the relevant Figures.

In the third embodiment, the semiconductor device manufacture method has been described in which the SiN film 7 is made easy to be removed when the contact hole 11c reaching the first wiring layer is formed. There is a possibility of forming a step over the first wiring layer when the third wiring layer (bit line) is formed over the first wiring layer, resulting in an insufficient planarization for multilayer wiring.

In the fourth embodiment, a semiconductor device is manufactured while the sizes of the contact holes 11b and 11c to the first wiring layer and the thickness of the third wiring layer are taken into consideration. It is possible to provide a semiconductor device excellent in planarization.

Figure 5:
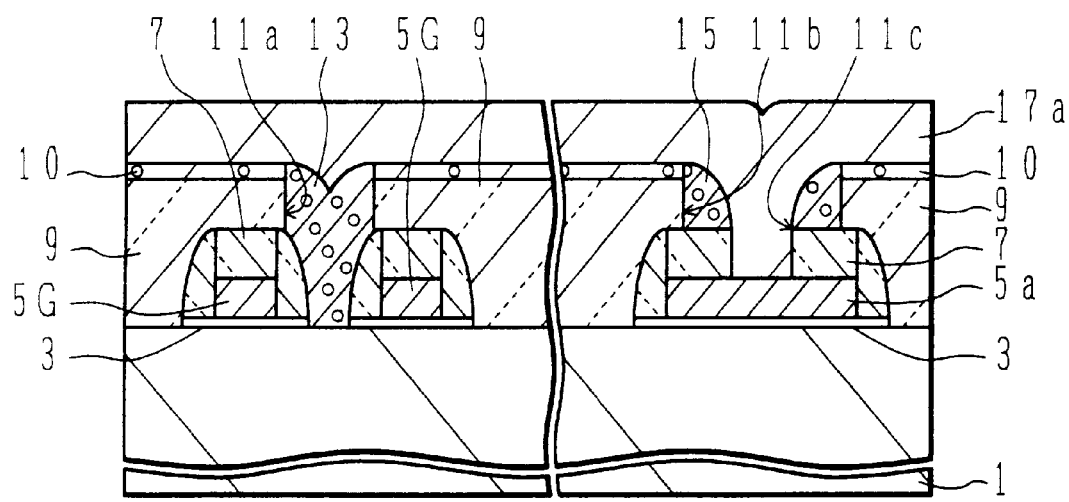
FIG. 5 is a cross sectional view of a semiconductor device according to the fourth embodiment of the invention.

The fourth embodiment of the invention will be described in detail with reference to FIG. 5. FIG. 5 shows cross sectional views of a semiconductor device in main manufacture processes according to the fourth embodiment. This semiconductor device is an improved device of the semiconductor device of the third embodiment described with FIGS. 4A to 4E. In FIG. 5, identical reference numerals to those shown in FIGS. 4A to 4E indicate like elements.

In the fourth embodiment, the diameter of a contact hole 11a to the substrate is set to 0.15 $\mu$m, the diameter of a contact hole 11b to the first wiring layer is set to 0.30 $\mu$m, and the thickness of a doped silicon layer forming a plug 13 and a side wall 15 is set to 100 nm. The diameter of a contact hole 11c reaching the first wiring layer becomes about 0.14 $\mu$m.

If a conductive layer having a film thickness of 70 nm or larger is formed as the third wiring layer 17a, the contact hole 11c can be completely filled with the third wiring layer. It is therefore possible to improve planarization after the conductive layer is patterned to form the third wiring layer. The third wiring layer may be: a lamination of a doped silicon layer and a WSi layer; a conductive layer such as a Ti layer, TiN layer and W layer; or a combination thereof.

5th Embodiment

Next, the fifth embodiment will be described with reference to the relevant Figures.

In the third and fourth embodiments, the doped silicon layer 10 and bit line 17 are formed on the BPSG film 9 serving as an interlayer insulating film. As compared with the first and second embodiments, the bit line is formed at the level higher than by the thickness of the doped silicon layer 10. There may be a larger step at later processes and photolithography becomes difficult.

In the fifth embodiment, polysilicon of the third and fourth embodiments is used as the bit line so that the height of the bit line can be lowered.

The fifth embodiment of the invention will be described in detail with reference to FIGS. 6A to 6E.

FIGS. 6A to 6E are cross sectional views of a semiconductor device in main manufacture processes according to the fifth embodiment. This semiconductor device is an improved device of the semiconductor device of the third embodiment described with FIGS. 4A to 4E. In FIGS. 6A to 6E, identical reference numerals to those shown in FIGS. 4A to 4E indicate like elements.

Figure 6A:
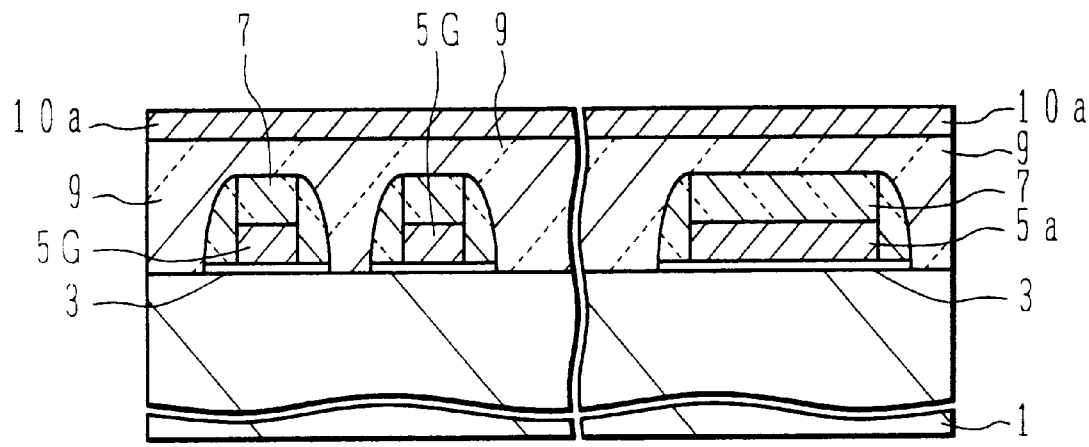
FIGS. 6A to 6E are cross sectional views of a semiconductor device in main manufacture processes illustrating the fifth embodiment of the invention.

Reference is made to FIG. 6A. After the process shown in FIG. 2A, a TiN layer 10a of 50 to 100 nm is formed by low pressure CVD. The TiN layer may be replaced by a doped silicon layer, a W layer or the like.

Figure 6B:
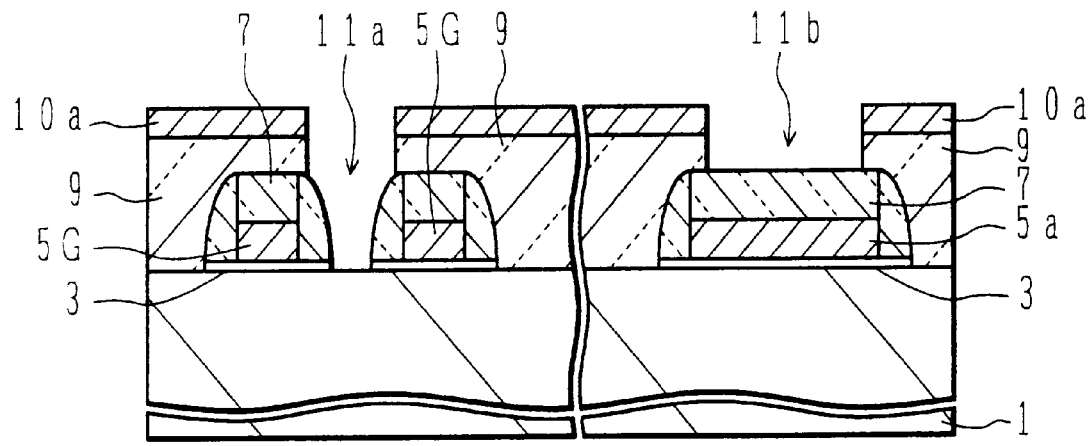

Reference is made to FIG. 6B. By using a patterned resist mask (not shown), the TiN layer 10a and BPSG film 9 are selectively etched to form a contact hole 11a to the substrate and a contact hole 11b to the first wiring layer through SAC. In this case, it is preferable to set the diameter of the contact hole 11b to about 0.30 $\mu$m if the diameter of the contact hole 11a is set to about 0.15 $\mu$m.

At this stage, the contact hole 11a to the substrate is formed in a self-aligned manner relative to the gate electrode 5G and reaches the substrate, whereas the contact hole 11b to the first wiring layer stops at the SiN film 7.

Figure 6C:
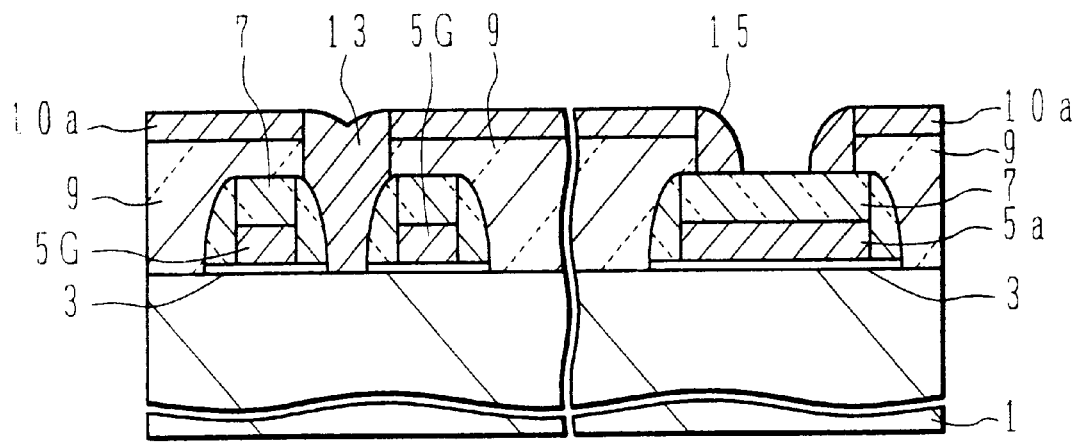

Reference is made to FIG. 6C. By using the process same as that of the first embodiment described with FIG. 2C, a plug 13 and a side wall 15 are formed.

Figure 6D:
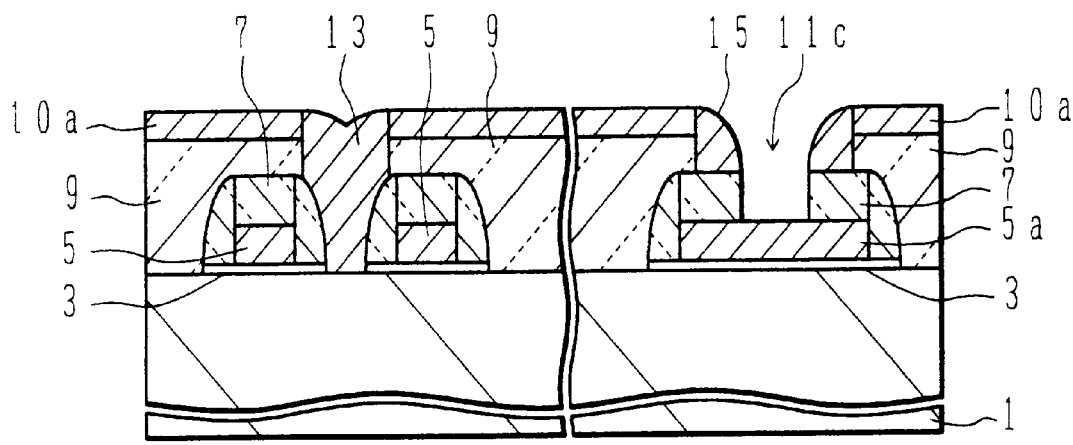

Reference is made to FIG. 6D. By using as a mask the TiN layer 10a, plug 13 and side wall 15, the SiN film 7 on the first wiring layer is dry-etched and removed to thereby form a contact hole 11c reaching the first wiring layer 5a in a self-aligned manner, by using a mixed gas of $CF_4$, $CHF_3$ and Ar.

If TiN is used as the conductive material of the plug 13 and side wall 15, only an etching selection ratio of TiN to SiN is required to be sufficient so that the above etching process can be made easy.

Figure 6E:
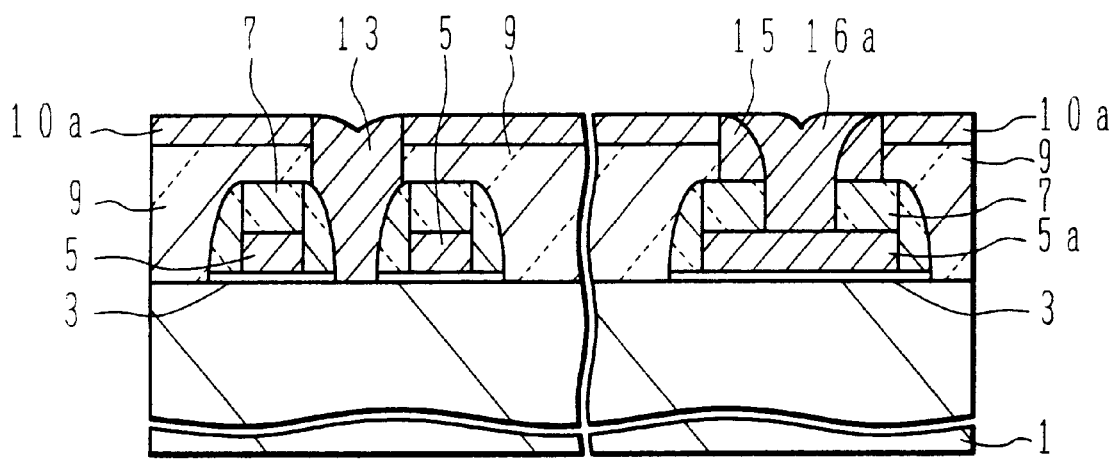

Reference is made to FIG. 6E. A TiN film of 70 to 100 nm thick is formed and etched back or subjected to CMP to thereby form a second plug 16a also in a contact hole 11c reaching the first wiring layer. This second plug 16a has a function of connecting the first wiring layer to the third wiring layer (bit line).

Next, by using a patterned resist mask (not shown), the TiN layer 10a is selectively etched to form a bit line.

In the fifth embodiment, in order to form the contact hole 11c reaching the first wiring layer, the TiN layer 10a is used in common for both the bit line and the stopper in etching the SiN film 7. Accordingly, the total height of the semiconductor device can be lowered and lithography becomes easy when another contact hole to the substrate is formed at a later process.

6th Embodiment

In the first to fifth embodiments, self-aligned contact using the SiN film only on the top and side walls of the gate electrode 5G and second wiring layer 5a has been described. The invention is not limited only to such self-aligned contact, but is also applicable to self-aligned contact using the SiN film formed over the substrate whole surface.

The sixth embodiment of the invention will be described in detail with reference to FIGS. 7A to 7F. In FIGS. 7A to 7F, identical reference numerals to those shown in FIGS. 2A to 6E indicate like elements.

FIGS. 7A to 7F are cross sectional views of a semiconductor device in main manufacture processes illustrating the sixth embodiment of the invention. The left side of each Figure shows the memory cell portion and the right side shows the peripheral circuit portion. These cross sectional views are taken along line A-A' of the plan view of FIG. 1.

A semiconductor device manufacture method of the sixth embodiment will be described with reference to FIGS. 7A to 7F.

Figure 7A:
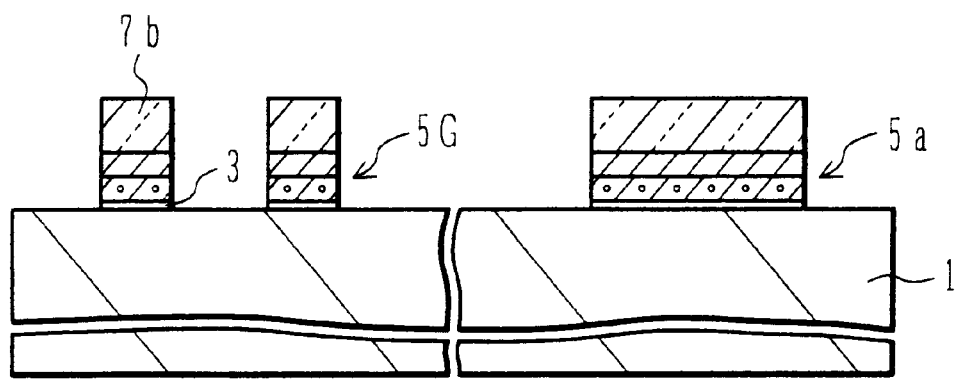
FIGS. 7A to 7E are cross sectional views of a semiconductor device in main manufacture processes illustrating the sixth embodiment of the invention.

Reference is made to FIG. 7A. An SiO$_2$ (not shown) is formed 250 nm thick on a p-type silicon substrate 1 by known techniques of LOCOS.

Next, an SiO$_2$ film 3 serving as a gate oxide film is formed 5 to 8 nm thick by thermal oxidation in the active region defined by the field SiO$_2$ film.

Next, a doped silicon layer of 50 nm thick containing n- or p-type impurities at a high concentration, a WSi layer of 100 to 120 nm thick and an SiO$_2$ film of 50 nm thick are sequentially formed over the whole surface of the substrate by CVD. The doped silicon layer may be polysilicon or amorphous silicon.

Next, by using a patterned resist mask (not shown), the SiO$_2$ film is selectively etched by F containing etchant and the WSi and doped silicon layers are selectively etched by Cl containing etchant to thereby form a gate electrode 5G in the memory cell portion, a first wiring layer 5a in the peripheral circuit portion, and an SiO$_2$ film pattern 7b on the gate electrode and first wiring layer. The gate electrode 5G serves as the word line.

Next, by using the gate electrode 5G as a mask, P (phosphorous) ions are implanted into the silicon substrate 1 to form n-type impurity diffusion regions (not shown). The n-type impurity diffusion regions are used as the source and drain regions (not shown) of a transfer transistor in the memory cell portion and as lightly doped drain (LDD) diffusion regions (not shown) of an n-channel transistor in the peripheral circuit portion.

Figure 7B:
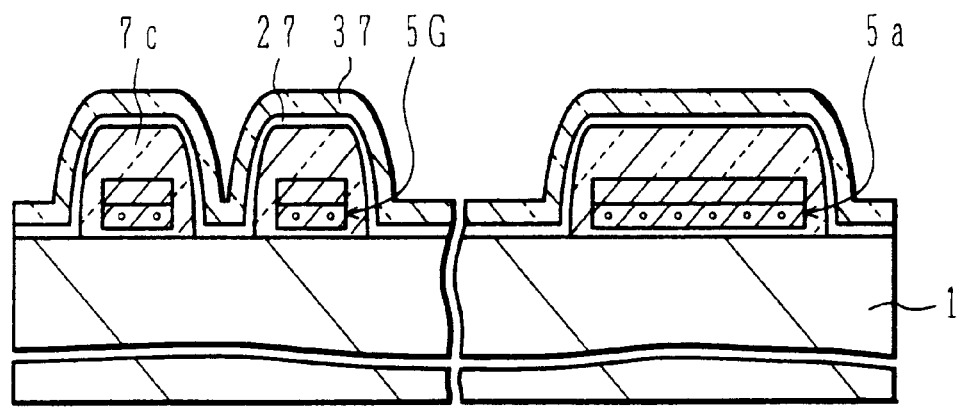

Reference is made to FIG. 7B. An SiO$_2$ film is formed 30 to 60 nm thick, preferably 50 nm thick, on the substrate whole surface by low pressure CVD and anisotropically etched to form side walls made of a SiO$_2$ film 7c which covers the gate electrode 5G.

Next, an SiO$_2$ film 27 is formed 10 to 20 nm thick and an SiN film 37 is formed 30 to 70 nm thick over the substrate whole surface by low pressure CVD.

Figure 7C:
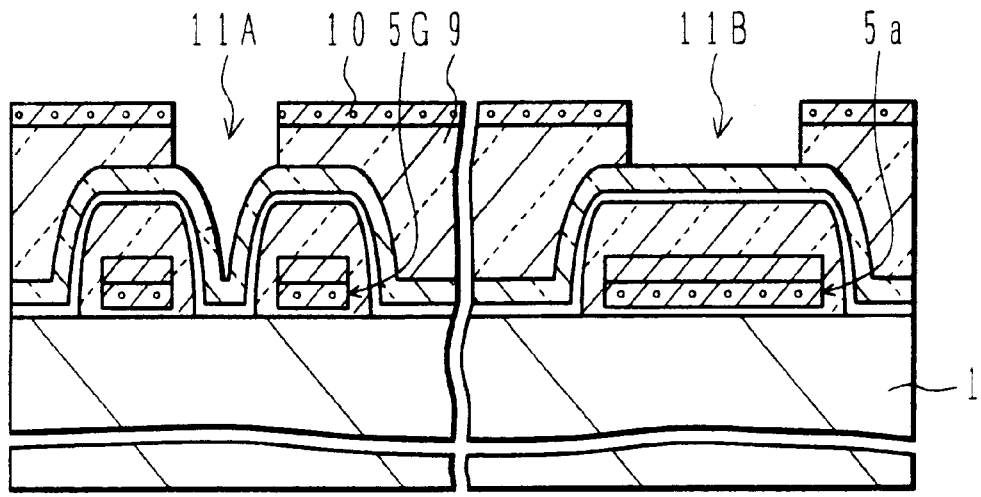

Reference is made to FIG. 7C. A BPSG film 9 is formed 200 to 400 nm thick over the substrate whole surface and reflowed by heat treatment at about 800° C. in a nitrogen atmosphere to planarize it. In order to planarize this film perfectly, it is preferable to use chemical mechanical polishing (CMP) to polish the surface of the BPSG film 9.

The BPSG film may be replaced by a PSG film, an SOG film, an insulating resin film or the like.

A doped silicon layer 10 is formed 50 nm thick on the BPSG film 9.

Next, by using a patterned resist mask (not shown), the doped silicon layer 10 and BPSG film 9 are selectively etched to form a contact hole 11a to the substrate and a contact hole 11b to the first wiring layer 5a, by SAC. It is preferable to set the diameter of the contact hole 11b to about 0.45 μm if the diameter of the contact hole 11a is set to about 0.15 μm.

Figure 7D:
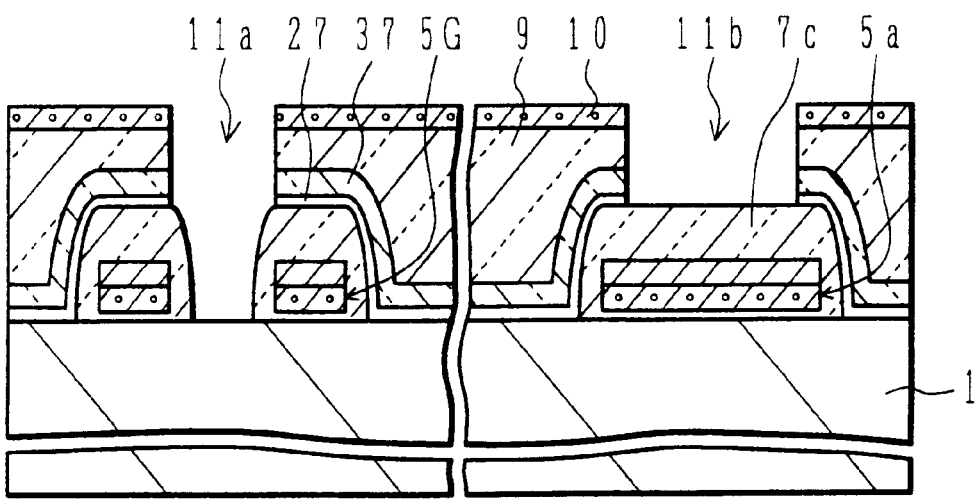

Reference is made to FIG. 7D. The SiN film 37 is etched at a large etching selection ratio relative to the SiO$_2$ film 27. At this stage, the SiO$_2$ film 27 is exposed. The SiO$_2$ film 27 is further etched. At this stage, the contact hole 11a to the substrate is formed in a self-aligned manner relative to the gate electrode 5G and reaches the substrate, whereas the contact hole 11b to the first wiring layer 5a stops at the Si0$_2$ film 7b.

Figure 7E:
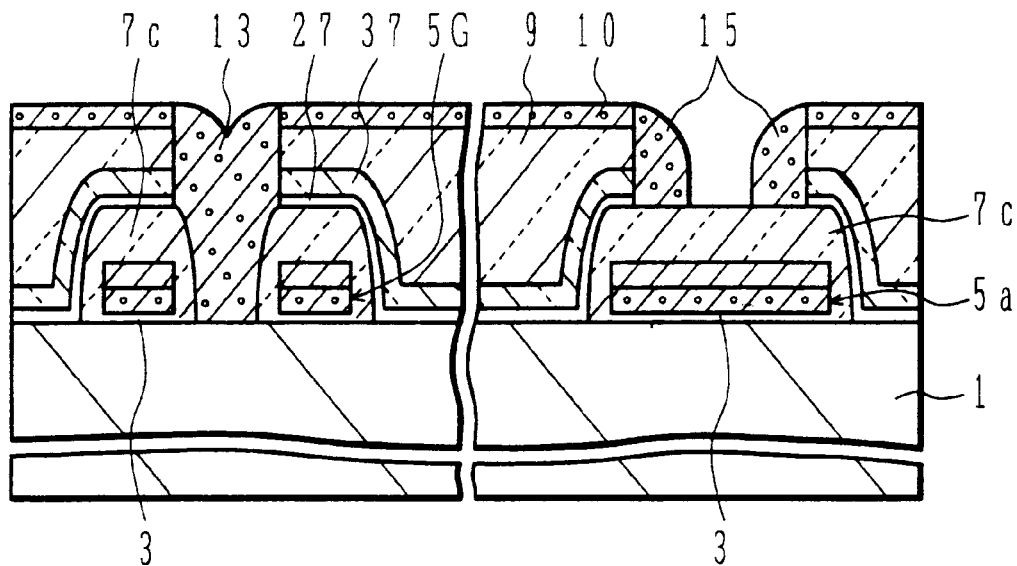

Reference is made to FIG. 7E. A doped silicon layer is formed 100 nm thick by low pressure CVD. The doped silicon layer is filled in the narrow contact hole 11a, but it is not completely filled in the broad contact hole 11b to the first wiring layer. The thickness of the doped silicon layer is so determined that although it is filled in the contact hole 11a, it is not completely filled in the contact hole 11b, as described earlier.

Next, anisotropic etching is performed to form a plug 13 in the contact hole 11a to the substrate and a side wall 15 in the contact hole 11b to the first wiring layer.

The doped silicon layer may be replaced by another conductive layer such as W and TiN to form the plug 13 and side wall 15.

Figure 7F:
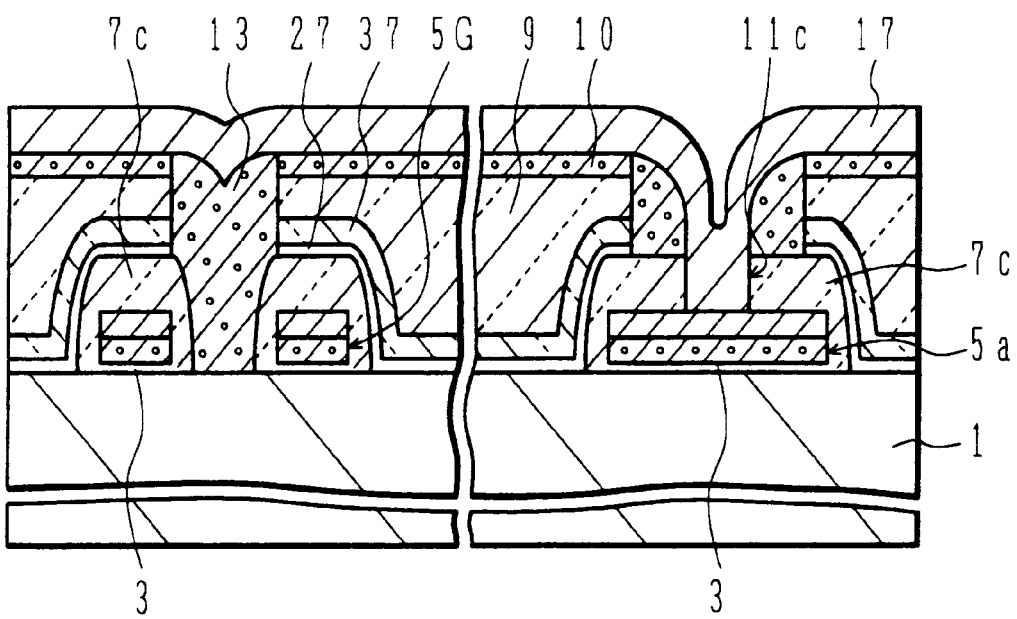

Reference is made to FIG. 7F. By using the doped silicon layer 10, plug 13 and side wall 15 as a mask, the SiO$_2$ film 7c on the first wiring layer 5a is etched to form a contact hole 11c reaching the first wiring layer in a self-aligned manner.

Next, a doped silicon layer of 30 nm thick and a WSi layer of 70 nm thick are sequentially formed over the substrate whole surface by low pressure CVD. By using a patterned resist mask (not shown), these layers are selectively removed to form a bit line 17.

Thereafter, an interlayer insulating film, a capacitor and a wiring layer are formed as necessary to complete a DRAM manufacture.

In the sixth embodiment, the silicon oxide film is used as the side wall of the gate electrode. As compared to the SiN film used as the side wall, hot carrier resistance can be improved and a transistor with good reliability can be formed.

7th Embodiment

In the first to sixth embodiments, there is a fear of surface damages of the silicon substrate 1. Namely, the surface of the substrate 1 is exposed twice to an anisotropic etching atmosphere, when the side spacers are formed on the side walls of the gate electrode 5G and when the contact hole 11a to the substrate is formed. There is therefore a possibility of forming defects in the substrate 1, particularly a possibility of degrading refresh characteristics of DRAMs.

In the seventh embodiment, a semiconductor device with good refresh characteristics is provided by limiting the number of exposures of the surface of the silicon substrate 1 to an etching atmosphere only to once.

The seventh embodiment of the invention will be described in detail with reference to FIGS. 8A to 8F.

FIGS. 8A to 8F are cross sectional views of a semiconductor device in main manufacture processes according to the seventh embodiment. This semiconductor device is an improved device of the semiconductor device of the third embodiment described with FIGS. 4A to 4F. In FIGS. 8A to 8F, identical reference numerals to those shown in FIGS. 4A to 4E indicate like elements.

Manufacture processes of the semiconductor device of this embodiment are similar to the first and third embodiments. Different points from the first and third embodiments will be described hereinunder.

Figure 8A:
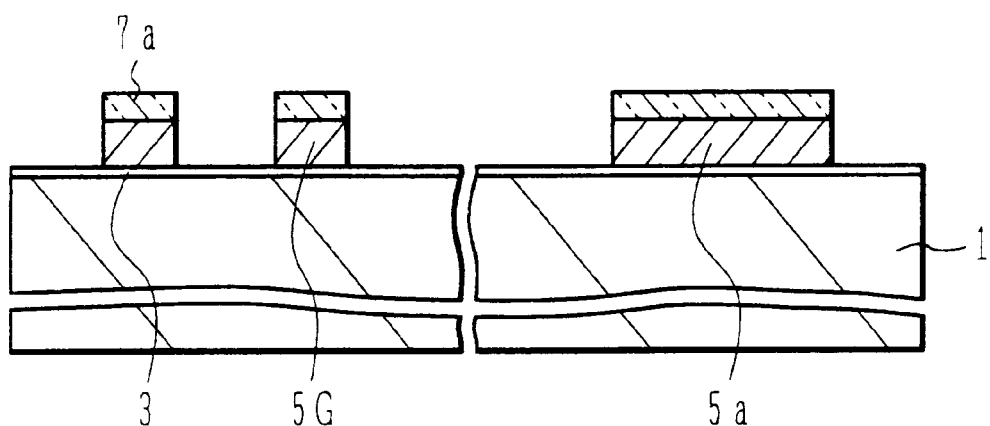
FIGS. 8A to 8F are cross sectional views of a semiconductor device in main manufacture processes illustrating the seventh embodiment of the invention.

Reference is made to FIG. 8A. Similar to the process described with FIG. 2A, after a gate oxide film 3 is formed, a doped silicon layer of 50 nm thick, a WSi layer of 100 to 120 nm thick and an SiN film of 80 to 100 nm thick are sequentially formed.

Next, similar to the process described with FIG. 2A, by using a patterned resist mask (not shown), the SiN film, WSi film and doped silicon layer are selectively etched to form a gate electrode 5G, a first wiring layer 5a and SiN layers 7a on the gate electrode 5G and first wiring layer 5a.

Figure 8B:
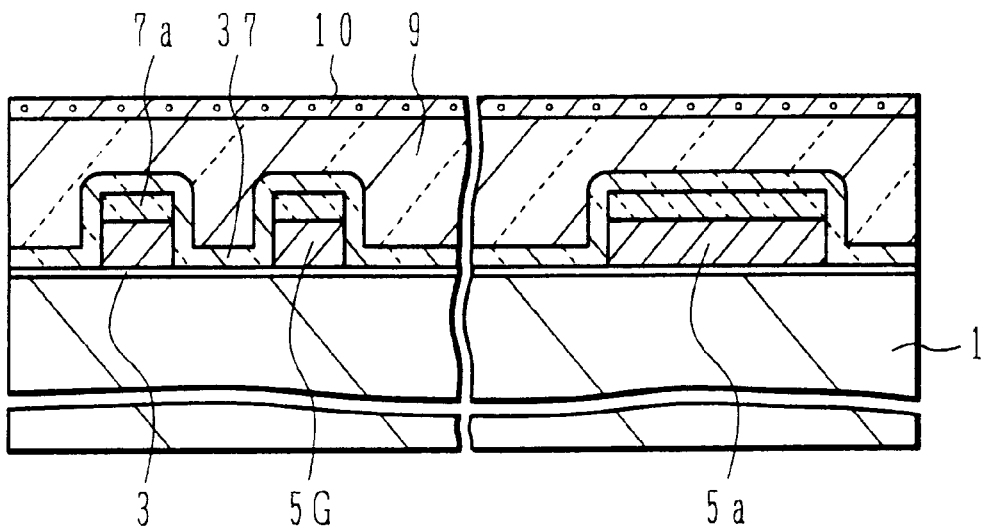

Reference is made to FIG. 8B. An SiN film 37 is formed 50 nm thick over the substrate whole surface by low pressure CVD. The SiN film 7a and SiN film 37 are therefore formed on the top of the gate electrode 5G, and the SiN film 37 having generally the same thickness as the SiN film 37 over the top of the gate electrode 5G is formed on the side walls of the gate electrode 5G and on the other area of the substrate 1. The SiN film 37 serves as a stopper film when a BPSG film 9 later formed is removed.

Next, similar to the process described with FIG. 2A, the BPSG film is formed. Then, a doped silicon layer 10 is formed 30 to 70 nm thick by low pressure CVD.

Figure 8C:
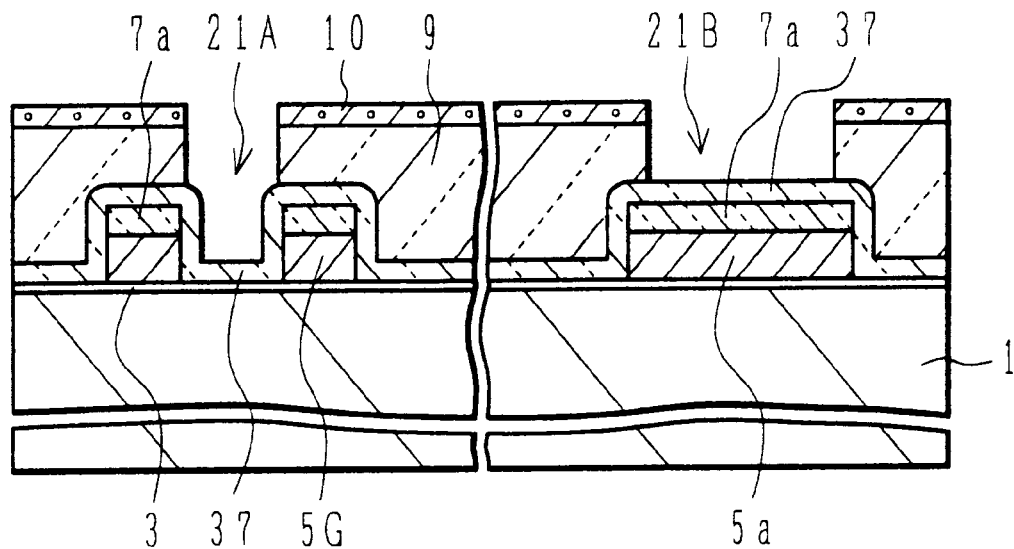

Reference is made to FIG. 8C. By using a patterned resist mask (not shown), the doped silicon layer and BPSG film 9 are selectively etched to form a contact hole 21A to the substrate and a contact hole 21B to the first wiring layer through SAC. It is preferable to set the diameter of the contact hole 21B to about 0.45 µm if the diameter of the contact hole 21A is set to about 0.15 µm.

At this stage, the contact hole 21A to the substrate and the contact hole 21B to the first wiring layer stop at the SiN film 37.

Figure 8D:
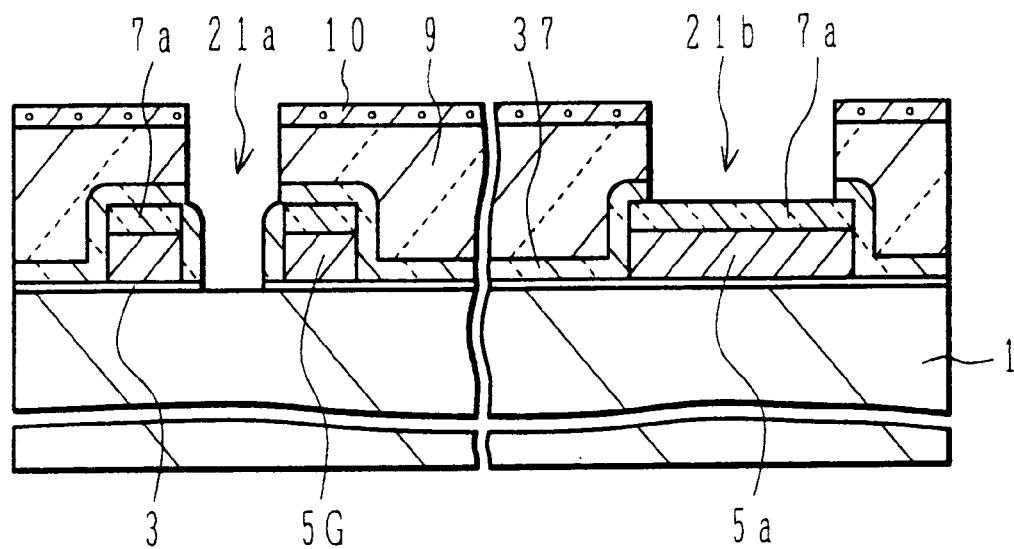

Reference is made to FIG. 8D. Then, the SiN film 37 is etched to form contact holes 21a and 21b. In this case, the etched film thickness is set to the thickness of the SiN film 37 formed on the substrate between wiring layers so that although the contact hole 21a to the substrate is formed by removing the SiN film 37 on the substrate, the SiN film 7a on the first wiring layer is not removed.

Figure 8E:
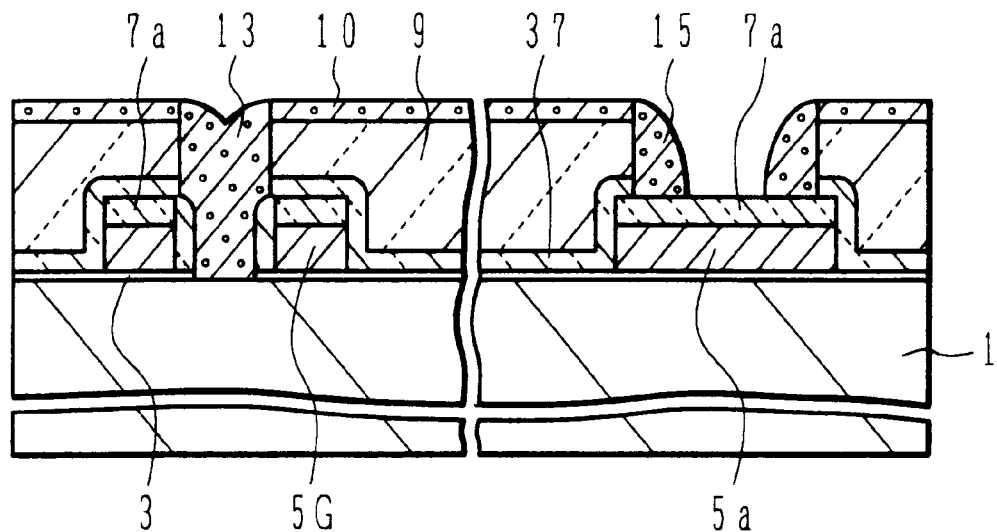

Reference is made to FIG. 8E. A doped silicon layer is formed 100 nm thick by low pressure CVD. Although this doped silicon layer is filled in the contact hole 21a, it is not completely filled in the contact hole 21b to the first wiring layer.

Next, anisotropic etching is performed to form a plug 13 in the contact hole to the substrate and a side wall 15 in the contact hole 21b to the first wiring layer.

The doped silicon layer may be replaced by another conductive layer such as W and TIN to form the plug 13 and side wall 15.

Figure 8F:
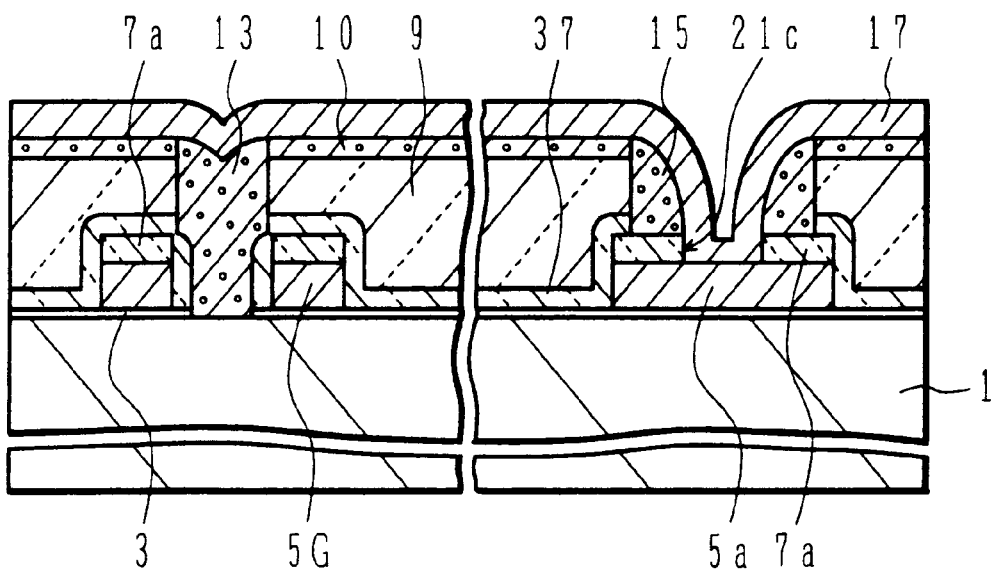

Reference is made to FIG. 8F. By using the doped silicon layer 10, plug 13 and side wall 15 as a mask, the SiN film 7a on the first wiring layer 5a is dry-etched by using a mixed gas of $CF_4$ and Ar to thereby form a contact hole 21c reaching the first wiring layer in a self-aligned manner.

Next, a doped silicon layer of 30 nm thick and a WSi layer of 70 nm thick are sequentially formed over the substrate whole surface by low pressure CVD. By using a patterned resist mask (not shown), these layers are selectively removed to form a bit line 17.

Thereafter, an interlayer insulating film, a capacitor and a wiring layer are formed as necessary to complete a DRAM manufacture.

In this embodiment, the substrate surface between two gate electrodes 5G is exposed only once to an anisotropic etching atmosphere when the contact hole 21a to the substrate is formed. In contrast, in the first embodiment, the substrate surface is exposed twice to an anisotropic etching atmosphere when the side walls of the SiN film 7 are formed and when the contact hole 11a to the substrate is formed.

This embodiment provides much merit for DRAMs whose substrate defects are required to be reduced as much as possible.

8th Embodiment

The eighth embodiment is a combination of the sixth and seventh embodiments and provides a semiconductor device with improved hot carrier resistance and refresh characteristics of DRAMs.

The eighth embodiment of the invention is illustrated in FIGS. 9A to 9F.

FIGS. 9A to 9F are cross sectional views of a semiconductor device in main manufacture processes according to the eighth embodiment. In FIGS. 9A to 9F, identical reference numerals to those shown in FIGS. 2A to FIG. 8F indicate like elements.

Figure 9A:
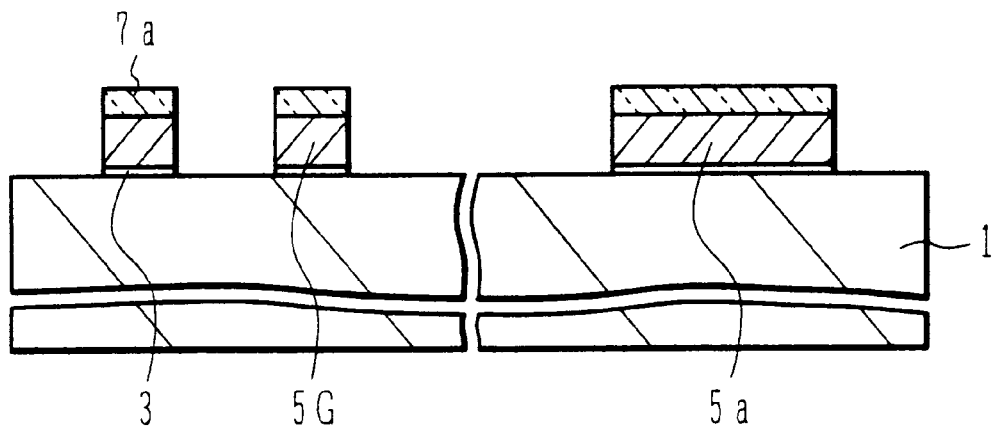
FIGS. 9A to 9F are cross sectional views of a semiconductor device in main manufacture processes illustrating the eighth embodiment of the invention.

Reference is made to FIG. 9A. A field $SiO_2$ (not shown) is formed 250 nm thick on a p-type silicon substrate 1 by known techniques of LOCOS. Thereafter, an $SiO_2$ film 3 of 5 to 7 nm thick serving as a gate oxide film is formed by thermal oxidation in the active region defined by the field $SiO_2$ film.

Next, a doped silicon layer of 50 nm thick containing n- or p-type impurities at a high concentration, a WSi layer of 100 to 120 nm thick and an $SiO_2$ film 7a of 50 nm thick are sequentially formed over the whole surface of the substrate by CVD.

Next, by using a patterned resist mask (not shown), the $SiO_2$ film 7b is selectively etched by F containing etchant and the WSi and doped silicon layers are selectively etched by Cl containing etchant to thereby form a gate electrode 5G in the memory cell portion and a first wiring layer 5a in the peripheral circuit portion.

Next, impurity ions are implanted into the silicon substrate 1 by well know techniques to form impurity diffusion regions (not shown).

Figure 9B:
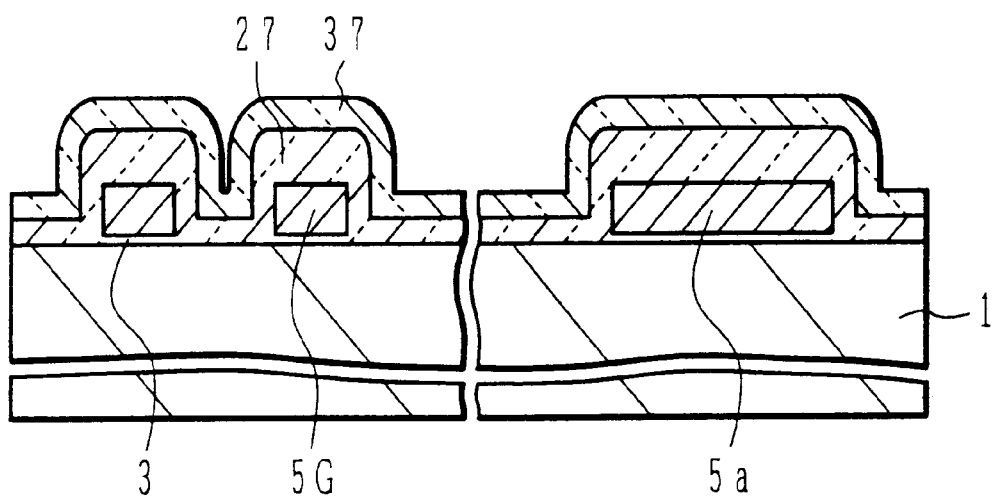

Reference is made to FIG. 9B. An $SiO_2$ film of 50 nm thick and an SiN film 37 of 30 to 70 nm are formed over the substrate whole surface by low pressure CVD.

Figure 9C:
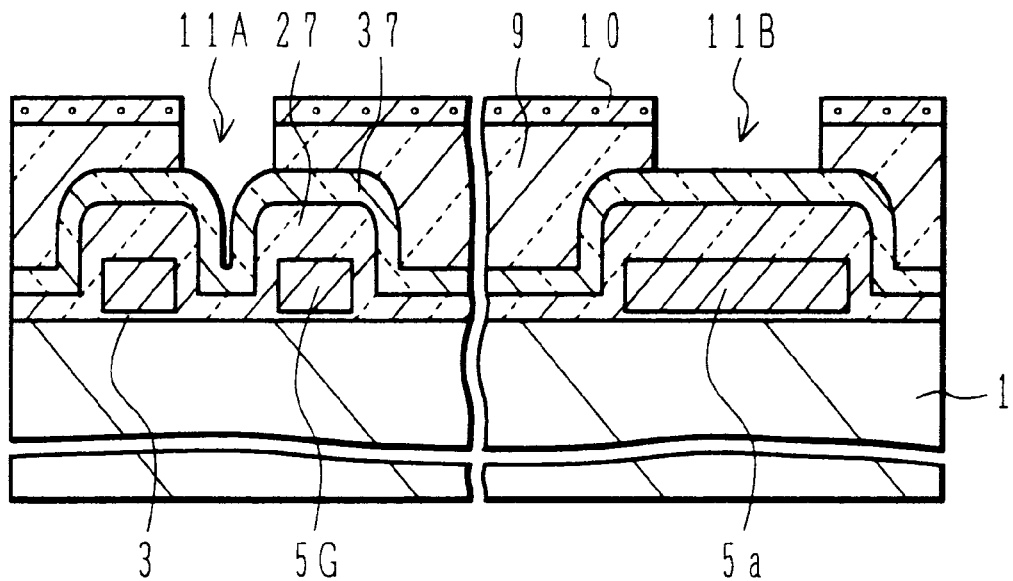

Reference is made to FIG. 9C. A BPSG film 9 is formed 200 to 400 nm thick over the substrate whole surface and reflowed by heat treatment at about 800° C. in a nitrogen atmosphere to planarize it. In order to planarize this film perfectly, it is preferable to use CMP to polish the surface of the BPSG film 9.

A doped silicon layer 10 is formed 50 nm thick on the BPSG film 9.

Next, by using a patterned resist mask (not shown), the doped silicon layer 10 and BPSG film 9 are selectively etched to form a contact hole 11A to the substrate and a contact hole 11B to the first wiring layer 5a, by SAC. It is preferable to set the diameter of the contact hole 11B to about 0.45 µm if the diameter of the contact hole 11A is set to about 0.15 µm.

Figure 9D:
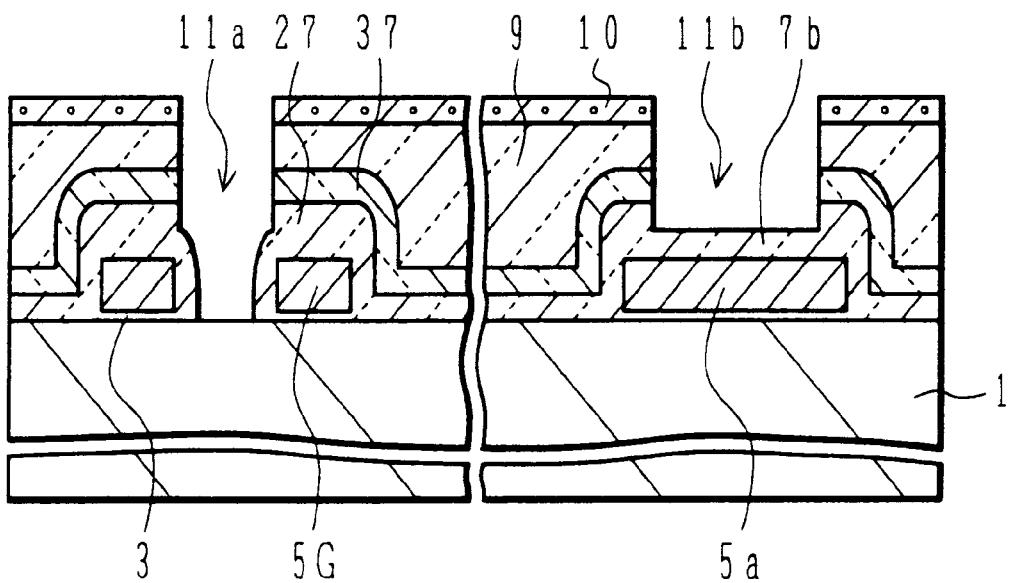

Reference is made to FIG. 9D. The SiN film 37 is etched at a large etching selection ratio relative to the $SiO_2$ film 27. At this stage, the $SiO_2$ film 27 is exposed. The $SiO_2$ film 27 is further etched. At this stage, a contact hole 11a to the substrate is formed in a self-aligned manner relative to the gate electrode 5G and reaches the substrate, whereas a contact hole 11b to the first wiring layer 5a stops at the $SiO_2$ film 7b.

Figure 9E:
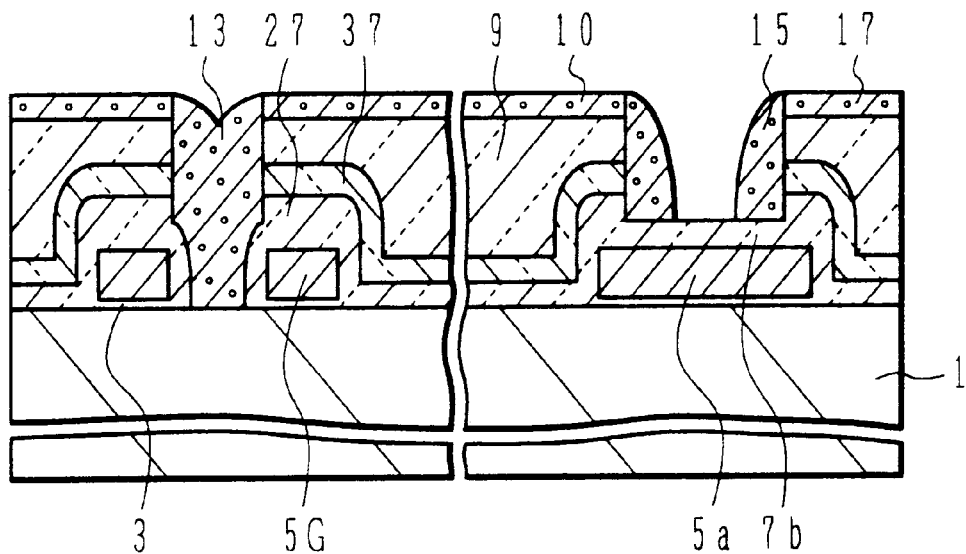

Reference is made to FIG. 9E. A doped silicon layer is formed 100 nm thick by low pressure CVD. This doped silicon layer is filled in the narrow contact hole 11a, but it is not completely filled in the broad contact hole 11b to the first wiring layer.

Next, anisotropic etching is performed to form a plug 13 in the contact hole 11a to the substrate and a side wall 15 in the contact hole 11b to the first wiring layer.

Figure 9F:
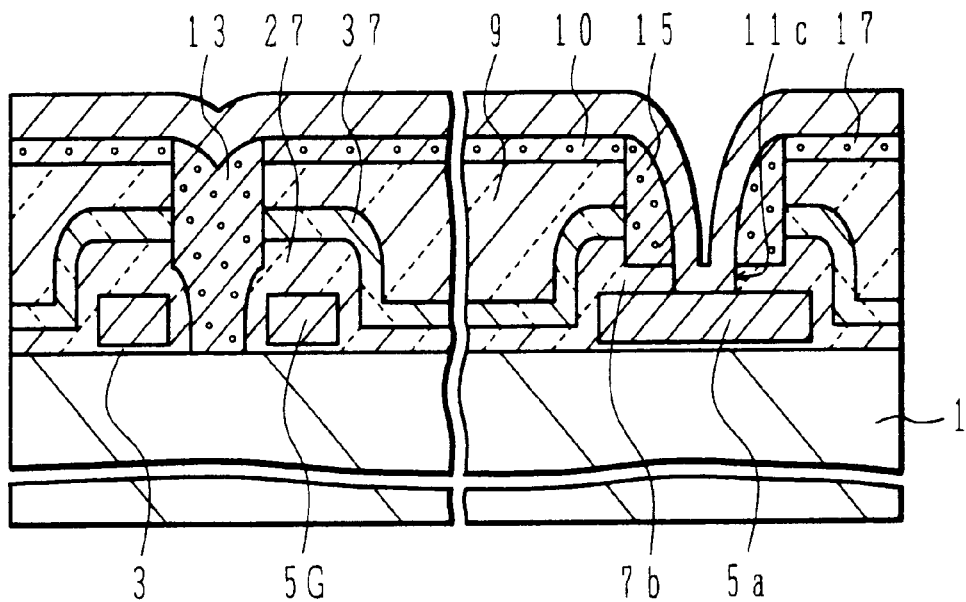

Reference is made to FIG. 9F. By using the doped silicon layer 10, plug 13 and side wall 15 as a mask, the $SiO_2$ film 7b on the first wiring layer is etched to form a contact hole 11c reaching the first wiring layer in a self-aligned manner.

Next, a doped silicon layer of 30 nm thick and a WSi layer of 70 nm thick are sequentially formed over the substrate whole surface by low pressure CVD. By using a patterned resist mask (not shown), these layers are selectively removed to form a bit line 17.

Thereafter, an interlayer insulating film, a capacitor and a wiring layer are formed as necessary to complete a DRAM manufacture.

In the eighth embodiment, the silicon oxide film is used as the side wall of the gate electrode. As compared to the SiN film used as the side wall, hot carrier resistance can be improved and a transistor with good reliability can be formed. Furthermore, since the surface of the silicon substrate 1 is exposed only once to an etching atmosphere when the contact hole 11a is formed, damages of the silicon substrate surface can be reduced considerably.

9th Embodiment

In the first to eighth embodiments, forming the contact hole to the first wiring layer is made easy by removing the SiN film on the first wiring in the peripheral circuit portion in a self-aligned manner.

In the ninth embodiment, a semiconductor device and its manufacture method are provided which are easy to form a contact hole to the substrate in the memory cell portion, a contact hole to the first wiring layer and a contact hole to the substrate in the peripheral circuit portion.

The ninth embodiment will be described in detail with reference to FIG. 10 and FIGS. 11A to 11C.

Figure 10:
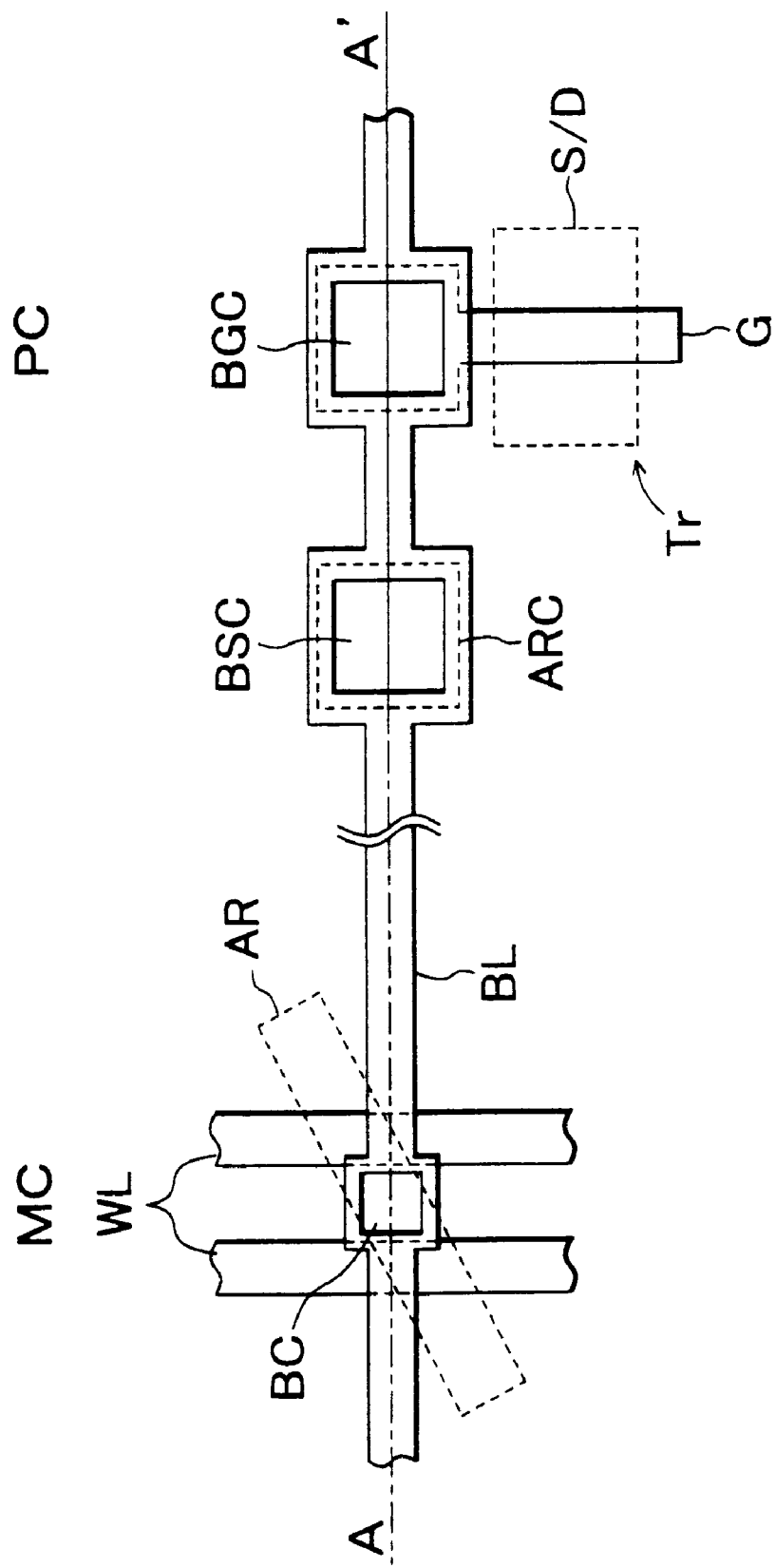
FIG. 10 is a plan view of a memory cell portion (MC) and a peripheral circuit portion (PC) of a semiconductor device according to ninth to twelfth embodiments of the invention.

FIG. 10 is a plan view of a memory cell portion MC and a peripheral circuit portion PC of a semiconductor device of the ninth embodiment. As different from the layout shown in FIG. 1, an active region ARC for substrate contact and a substrate contact BSC for a bit line BL are formed.

Figure 11A:
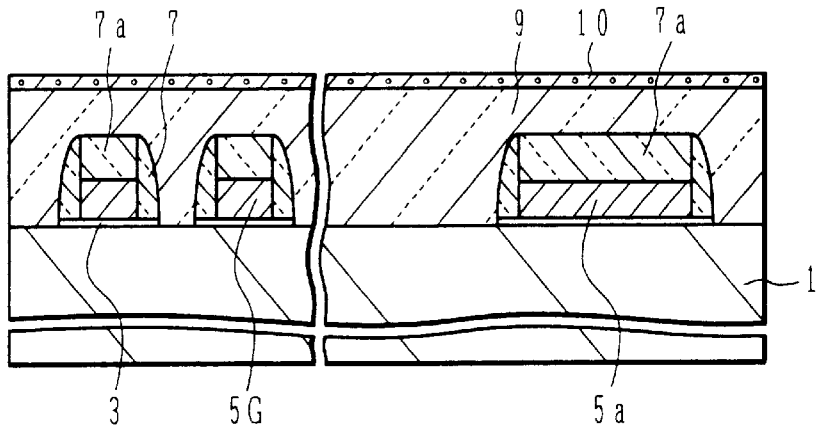
FIGS. 11A to 11C are cross sectional views of a semiconductor device in main manufacture processes illustrating the ninth embodiment of the invention.
Figure 11B:
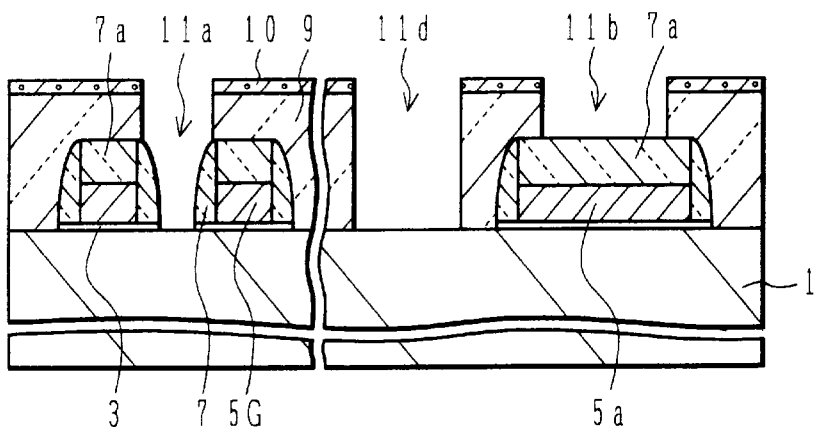
Figure 11C:
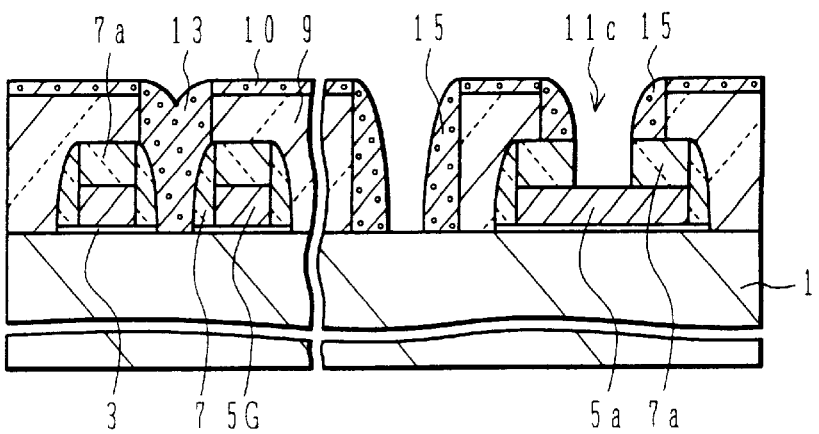

FIGS. 11A to 11C are cross sectional views of a semiconductor device in main manufacture processes illustrating the ninth embodiment of the invention. The left side of each Figure shows the memory cell portion and the right side shows the peripheral circuit portion. These cross sectional views are taken along line B-B' of the plan view of FIG. 10.

In this embodiment, manufacture processes similar to those described with the third embodiment are used. In FIGS. 11A to 11C, identical reference numerals to those of the third embodiment shown in FIGS. 4A to 4F indicate like elements.

Reference is made to FIG. 11A. Formed on a substrate 1 by using the method similar to that described with FIG. 4A are a gate oxide film 3, a gate electrode 5G, a first wiring layer 5a formed by the same process as the gate electrode 5G, SiN films 7a formed on the gate electrode 5G and first wiring layer 5a, an SiN film 7 covering the side walls of the gate electrode 5G, first wiring layer 5a and SiN film 7a, a BPSG film 9 and a doped silicon layer 10.

Reference is made to FIG. 11B. By using a patterned resist mask (not shown), the doped silicon layer 10 and BPSG film 9 are selectively etched to form a contact hole 11a to the substrate and a contact hole 11b to the first wiring layer 5a by SAC, and a contact hole 11d to the substrate not by SAC. It is preferable to set the diameter of the contact hole 11b to about 0.45 µm if the diameter of the contact hole 11a is set to about 0.15 µm. The diameter of the contact hole 11d to the substrate formed not by SAC is preferably about 0.30 to 0.45 µm.

At this stage, the contact hole 11a to the substrate and the contact hole 11d formed not by SAC reaches the substrate, although the contact hole 11b to the first wiring layer stops at the SiN film 7a.

Reference is made to FIG. 11C. A doped silicon layer is formed 100 nm thick by low pressure CVD. This doped silicon layer is filled in the narrow contact hole 11a, but it is not completely filled in the contact hole 11b to the first wiring layer and the contact hole 11d to the substrate formed not by SAC.

Next, anisotropic etching is performed to form a plug 13 in the contact hole 11a to the substrate and a side wall 15 in the contact hole 11b to the first wiring layer and the contact hole 11d to the substrate.

By using the doped silicon layer 10, plug 13 and side wall 15 as a mask, the $SiO_2$ film 7a on the first wiring layer is etched to form a contact hole 11c reaching the first wiring layer in a self-aligned manner.

By using the method similar to that described with FIG. 4E, a bit line (not shown) is formed.

In the ninth embodiment, only one mask is used for forming the contact hole to the substrate and the contact hole to the first wiring layer by SAC and the contact hole to the substrate not by SAC.

The contact hole 11d to the substrate formed not by SAC is not formed with a plug, but the bit line and the substrate are connected directly so that contact resistance can be lowered and a margin of designs can be increased.

A plug may be filled in the contact hole 11d to the substrate formed not by SAC. In this case, an underlying step when the bit line 17 is formed can be lowered.

10th Embodiment

The tenth embodiment will be described in detail with reference to FIG. 10 and FIGS. 12A to 12C.

Figure 12A:
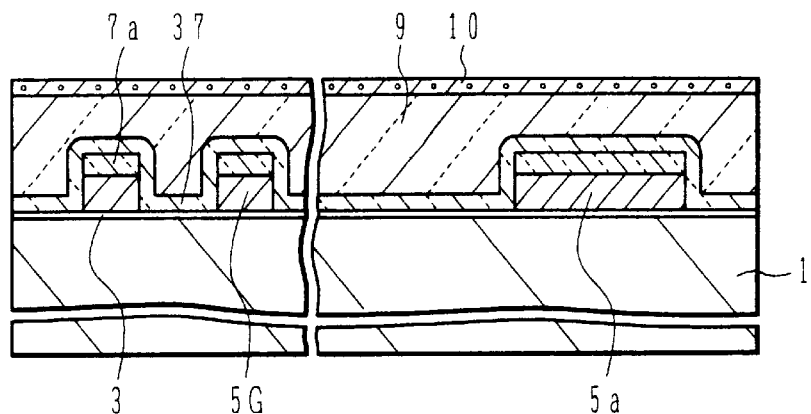
FIGS. 12A to 12C are cross sectional views of a semiconductor device in main manufacture processes illustrating the tenth embodiment of the invention.
Figure 12B:
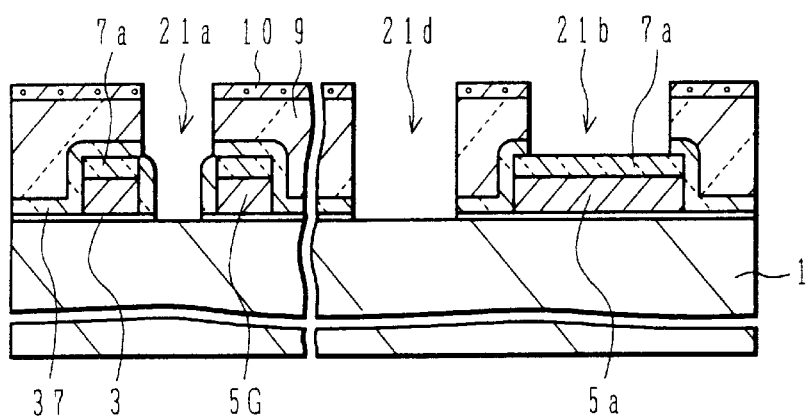
Figure 12C:
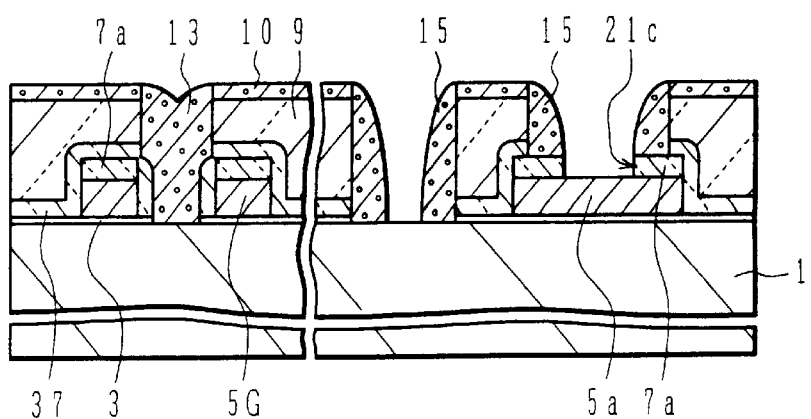

FIGS. 12A to 12C are cross sectional views of a semiconductor device in main manufacture processes illustrating the tenth embodiment of the invention. These cross sectional views are taken along line B-B' of the plan view of FIG. 10. In this embodiment, manufacture processes similar to those described with the seventh embodiment are used. In FIGS. 12A to 12C, identical reference numerals to those of the seventh embodiment shown in FIGS. 8A to 8F indicate like elements.

Reference is made to FIG. 12A. Formed on a substrate 1 by using the method similar to that described with FIGS. 8A and 8B are a gate oxide film 3, a gate electrode 5G, a first wiring layer 5a formed by the same process as the gate electrode 5G, SiN films 7a formed on the gate electrode 5G and first wiring layer 5a, an SiN film 37, a BPSG film 9 and a doped silicon layer 10.

Reference is made to FIG. 12B. By using a patterned resist mask (not shown), the doped silicon layer 10 and BPSG film 9 are selectively etched and removed. Then, the SiN film 37 is etched. In this-case, the etched film thickness is set to the thickness of the SiN film 37 formed on the substrate between wiring layers so that although the contact hole 21a to the substrate is formed by removing the SiN film 37 on the substrate, the SiN film 7a on the first wiring layer is not removed.

It is preferable to set the diameter of the contact hole 21b to about 0.45 µm if the diameter of the contact hole 21a is set to about 0.15 µm. The diameter of the contact hole 21d to the substrate formed not by SAC is preferably about 0.30 to 0.45 µm.

Reference is made to FIG. 12C. A doped silicon layer is formed 100 nm thick by low pressure CVD. This doped silicon layer is filled in the contact hole 21a, but it is only partially filled in the contact hole 21b to the first wiring layer and the contact hole 21d to the substrate formed not by SAC.

Next, anisotropic etching is performed to form a plug 13 in the contact hole 21a to the substrate and a side wall 15 in the contact hole 21b to the first wiring layer and the contact hole 21d to the substrate formed not by SAC.

The doped silicon layer may be replaced by another conductive layer such as W and TiN to form the plug 13 and side wall 15.

Next, by using the doped silicon layer 10, plug 13 and side wall 15 as a mask, the $SiO_2$ film 7a on the first wiring layer 5a is etched to form a contact hole 21c reaching the first wiring layer in a self-aligned manner.

By using the method similar to that described with FIG. 4E, a bit line (not shown) is formed.

In the tenth embodiment, advantages like the ninth embodiment can be obtained. Furthermore, as described with the seventh embodiment, substrate damages can be reduced.

11th Embodiment

The eleventh embodiment will be described in detail with reference to FIG. 10 and FIGS. 13A to 13C.

Figure 13A:
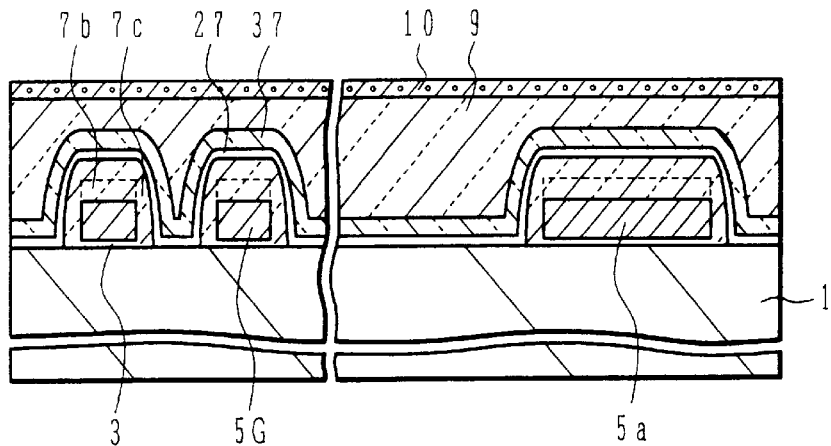
FIGS. 13A to 13C are cross sectional views of a semiconductor device in main manufacture processes illustrating the eleventh embodiment of the invention.
Figure 13B:
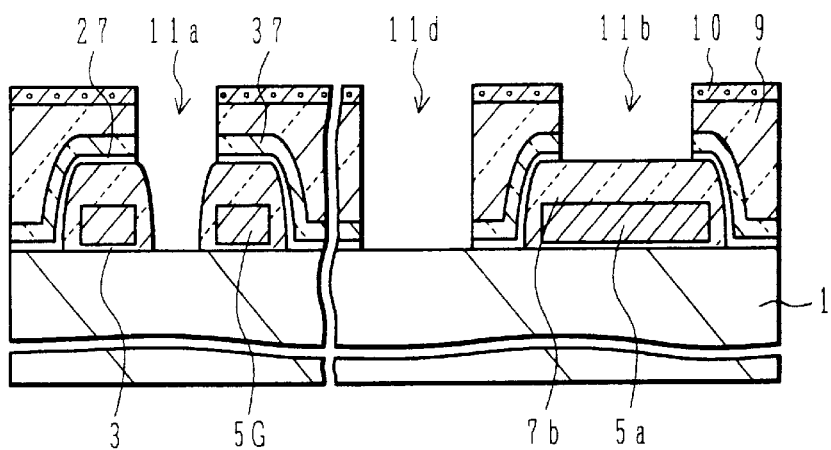
Figure 13C:
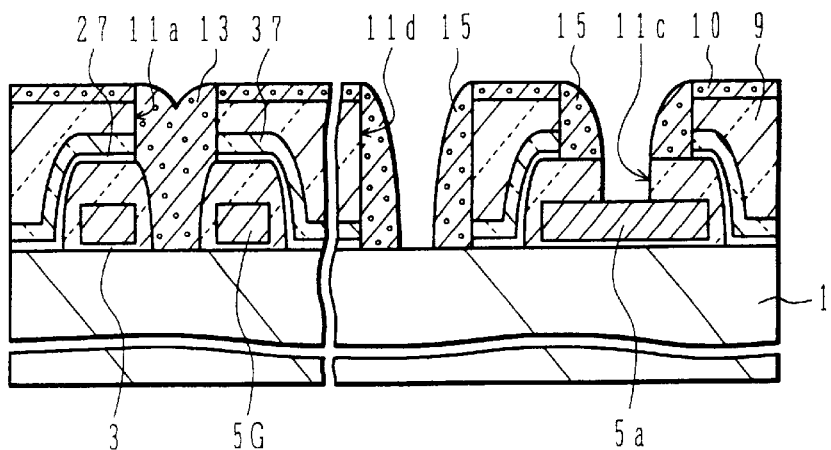

FIGS. 13A to 13C are cross sectional views of a semiconductor device in main manufacture processes illustrating the eleventh embodiment of the invention. These cross sectional views are taken along line B-B' of the plan view of FIG. 10. In this embodiment, manufacture processes similar to those described with the sixth embodiment are used. In FIGS. 13A to 13C, identical reference numerals to those of the sixth embodiment shown in FIGS. 7A to 7F indicate like elements.

Reference is made to FIG. 13A. Formed on a substrate 1 by using the method similar to that described with FIGS. 7A and 7B are a gate oxide film 3, a gate electrode 5G, a first wiring layer 5a formed by the same process as the gate electrode 5G, SiN films 7b formed on the gate electrode 5G and first wiring layer 5a, an $SiO_2$ film 7c covering the gate electrode 5G, first wiring layer 5a and SiN films 7b, an $SiO_2$ film 27, an SiN film 37, a BPSG film 9 and a doped silicon layer 10.

Reference is made to FIG. 13B. By using a patterned resist mask (not shown), the doped silicon layer 10 and BPSG film 9 are selectively etched and removed. Then, the SiN film 37 and $SiO_2$ film 27 are sequentially etched.

In this case, the etched thickness of the $SiO_2$ film 27 is set to the thickness of the SiN film 27 formed on the substrate between wiring layers so that although the contact hole 11a to the substrate is formed by removing the SiN film 27 on the substrate, the SiN film 7b on the first wiring layer is not removed.

It is preferable to set the diameter of the contact hole 11b to about 0.45 μm if the diameter of the contact hole 11a is set to about 0.15 μm. The diameter of the contact hole 11d to the substrate formed not by SAC is preferably about 0.30 to 0.45 μm.

Reference is made to FIG. 13C. A doped silicon layer is formed 100 nm thick by low pressure CVD. This doped silicon layer is filled in the contact hole 11a, but it is only partially filled in the contact hole 11b to the first wiring layer and the contact hole 11d to the substrate formed not by SAC.

Next, anisotropic etching is performed to form a plug 13 in the contact hole 11a to the substrate and a side wall 15 in the contact hole 11b to the first wiring layer and the contact hole 11d to the substrate formed not by SAC.

The doped silicon layer may be replaced by another conductive layer such as W and TiN to form the plug 13 and side wall 15.

Next, by using the doped silicon layer 10, plug 13 and side wall 15 as a mask, the $SiO_2$ film 7b on the first wiring layer 5a is etched to form a contact hole 11c reaching the first wiring layer in a self-aligned manner.

By using the method similar to that described with FIG. 4E, a bit line (not shown) is formed.

In the eleventh embodiment, advantages like the ninth embodiment can be obtained. Furthermore, as described with the sixth embodiment, hot carrier resistance can be improved.

12th Embodiment

The twelfth embodiment will be described in detail with reference to FIG. 10 and FIGS. 14A to 14C.

Figure 14A:
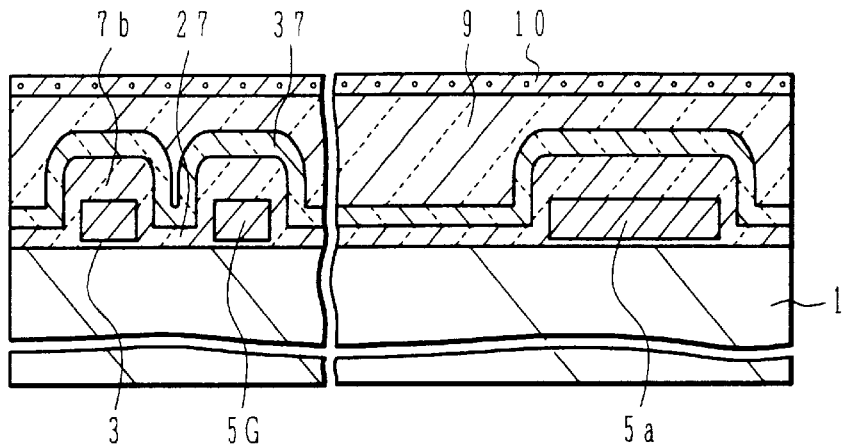
FIGS. 14A to 14C are cross sectional views of a semiconductor device in main manufacture processes illustrating the twelfth embodiment of the invention.
Figure 14B:
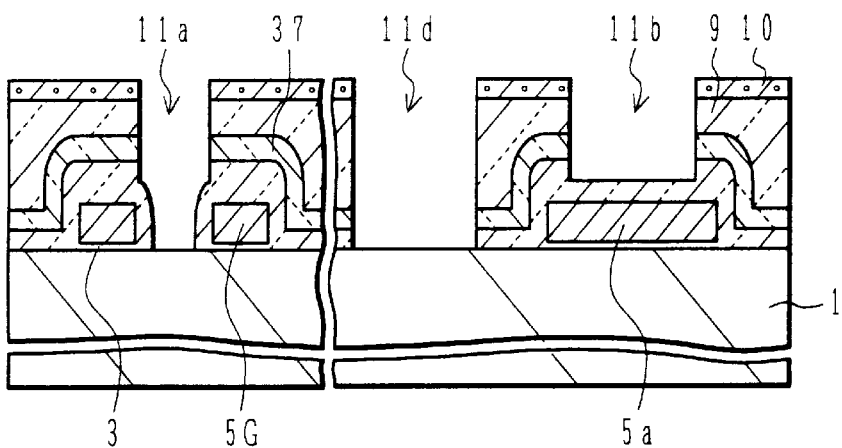
Figure 14C:
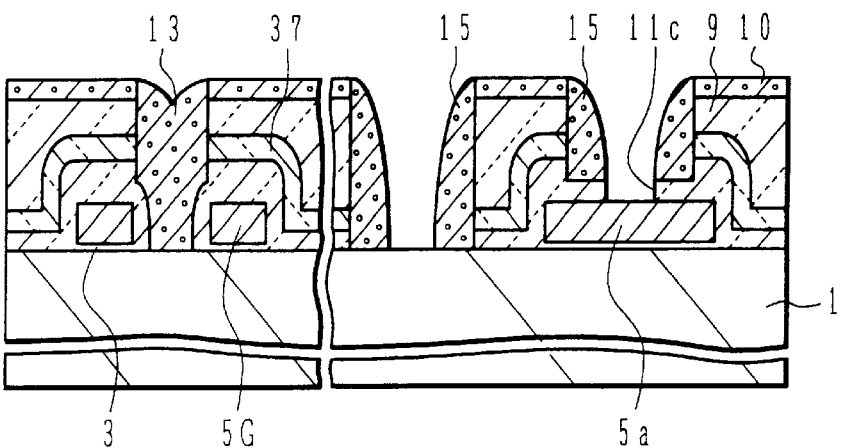
Figure 15A:
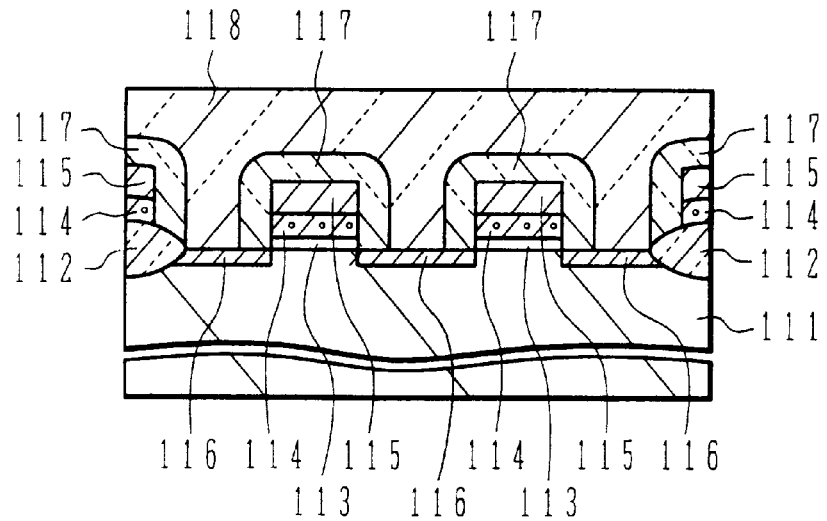
FIGS. 15A to 15D are cross sectional views of a conventional semiconductor device in main manufacture processes.
Figure 15B:
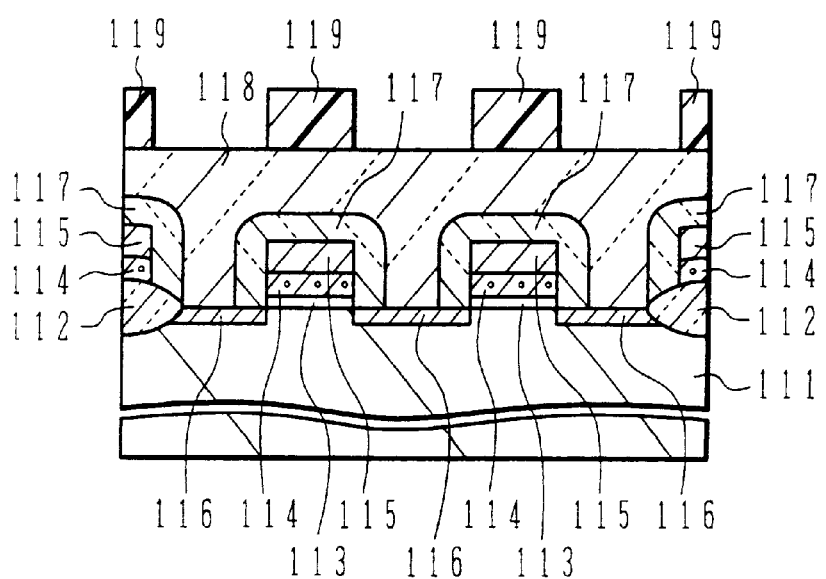
Figure 15C:
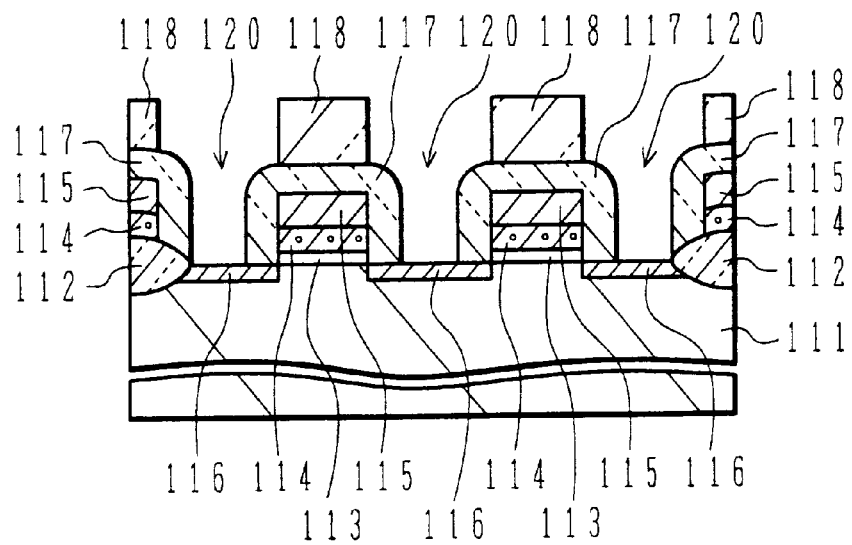
Figure 15D:
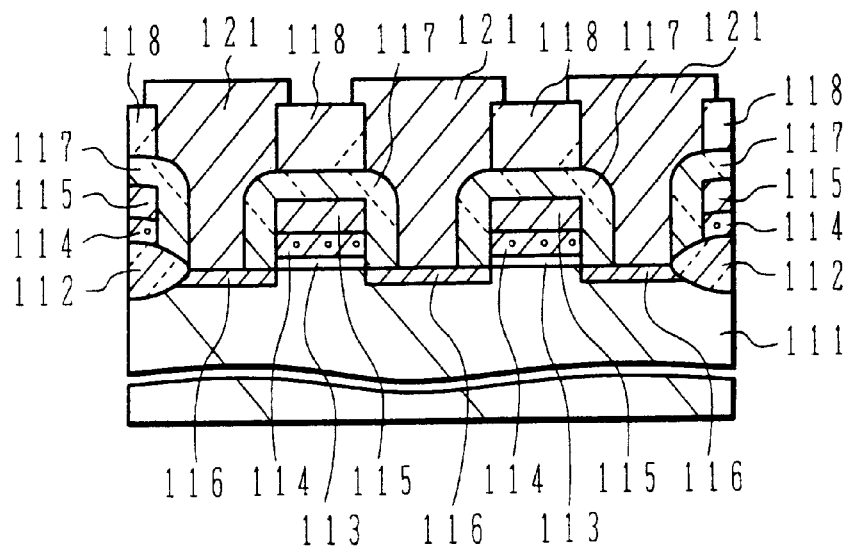
Figure 16A:
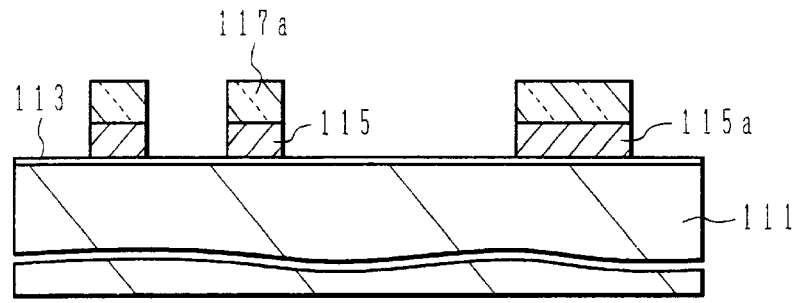
FIGS. 16A to 16C are cross sectional views of a semiconductor device in main manufacture processes used for explaining problems associated with conventional techniques.
Figure 16B:
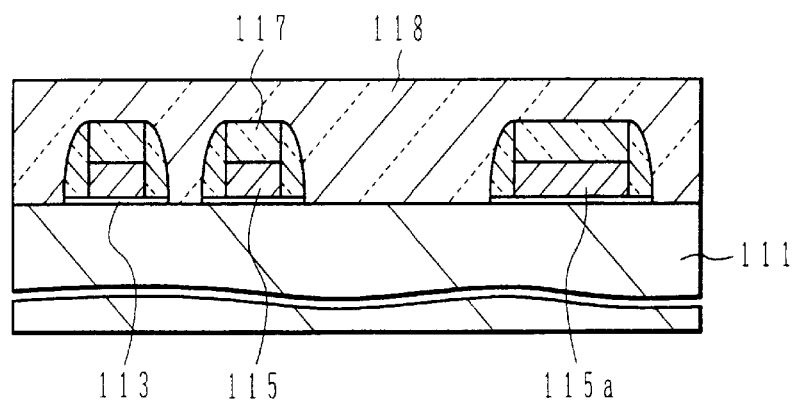
Figure 16C:
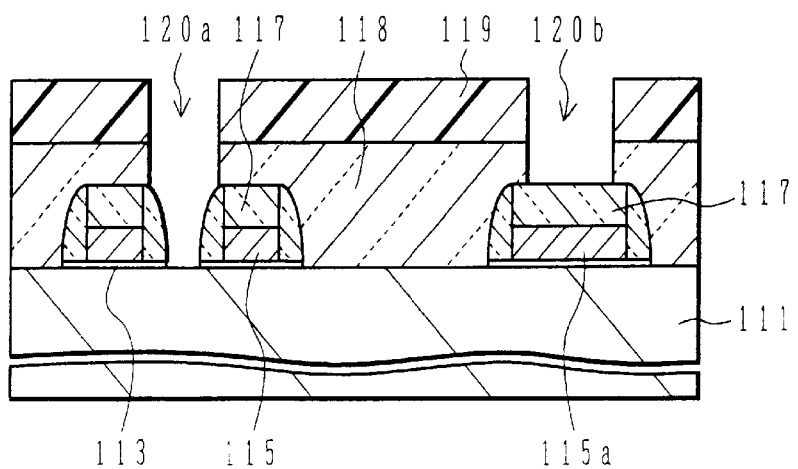
Figure 17A:
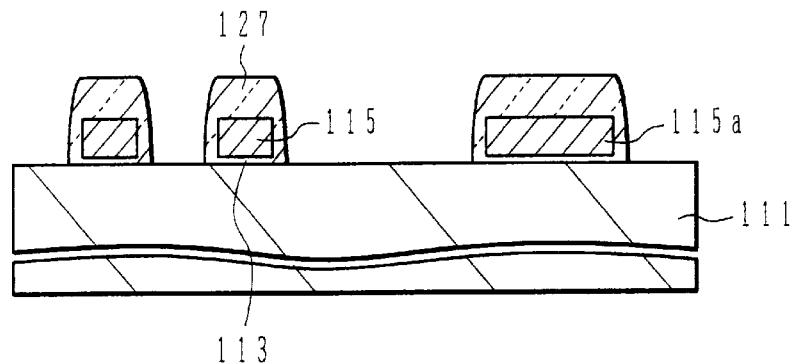
FIGS. 17A to 17C are cross sectional views of a semiconductor device in main manufacture processes used for explaining problems associated with conventional techniques.
Figure 17B:
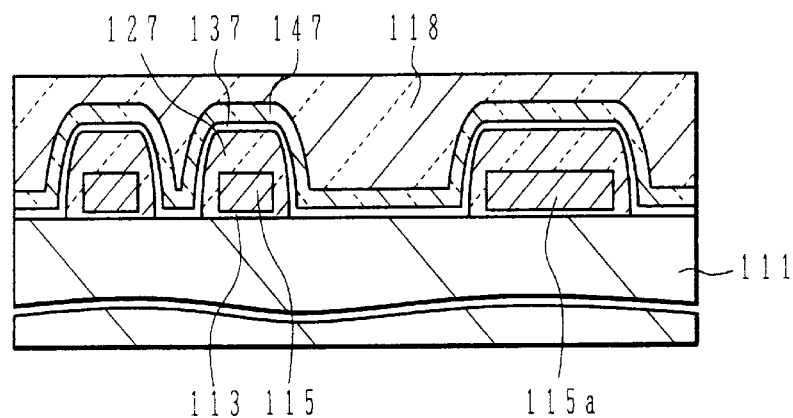
Figure 17C:
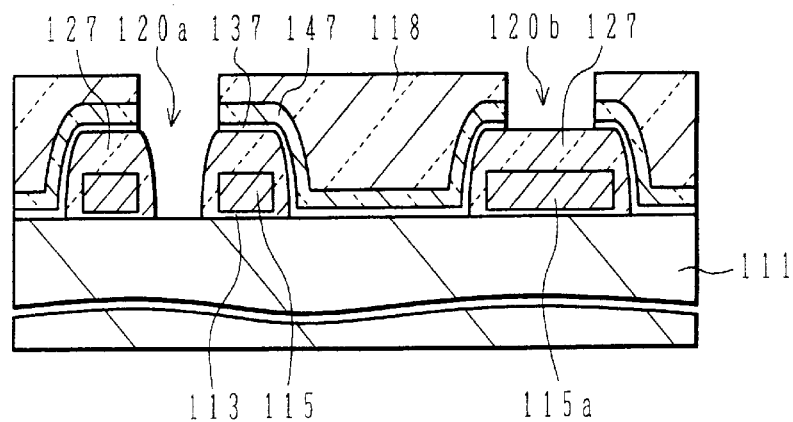

FIGS. 14A to 14C are cross sectional views of a semiconductor device in main manufacture processes illustrating the twelfth embodiment of the invention. These cross sectional views are taken along line B-B' of the plan view of FIG. 10. In this embodiment, manufacture processes similar to those described with the eighth embodiment are used. In FIGS. 14A to 14C, identical reference numerals to those of the eighth embodiment shown in FIGS. 9A to 9F indicate like elements.

Reference is made to FIG. 14A. Formed on a substrate 1 by using the method similar to that described with FIGS. 9A and 9B are a gate oxide film 3, a gate electrode 5G, a first wiring layer 5a formed by the same process as the gate electrode 5G, an $SiO_2$ film 7b, an $SiO_2$ film 27, an SiN film 37, a BPSG film 9 and a doped silicon layer 10.

Reference is made to FIG. 14B. By using a patterned resist mask (not shown), the doped silicon layer 10 and BPSG film 9 are selectively etched and removed. Then, the SiN film 37 and $SiO_2$ film 27 are sequentially etched.

In this case, the etched thickness of the $SiO_2$ film 27 is set to the thickness of the SiN film 27 formed on the substrate between wiring layers so that although the contact hole 11a to the substrate is formed by removing the SiN film 27 on the substrate, the SiN film 7b on the first wiring layer is not removed.

It is preferable to set the diameter of the contact hole 11b to about 0.45 μm if the diameter of the contact hole 11a is set to about 0.15 μm. The diameter of the contact hole 11d to the substrate formed not by SAC is preferably about 0.30 to 0.45 μm.

Reference is made to FIG. 14C. A doped silicon layer is formed 100 nm thick by low pressure CVD. This doped silicon layer is filled in the contact hole 11a, but it is only partially filled in the contact hole 11b to the first wiring layer and the contact hole 11d to the substrate formed not by SAC.

Next, anisotropic etching is performed to form a plug 13 in the contact hole 11a to the substrate and a side wall 15 in the contact hole 11b to the first wiring layer and the contact hole 11d to the substrate formed not by SAC.

The doped silicon layer may be replaced by another conductive layer such as W and TiN to form the plug 13 and side wall 15.

Next, by using the doped silicon layer 10, plug 13 and side wall 15 as a mask, the $SiO_2$ film 7b on the first wiring layer 5a is etched to form a contact hole 11c reaching the first wiring layer in a self-aligned manner.

By using the method similar to that described with FIG. 9F, a bit line (not shown) is formed.

In the twelfth embodiment, advantages like the ninth embodiment can be obtained. Furthermore, as described with the eighth embodiment, substrate damages can be reduced and hot carrier resistance can be improved.

In the embodiments described above, a self-aligned contact hole and a contact hole having a larger diameter than the self-aligned contact hole are formed. At the same time when the process of forming a conductive layer filling the self-aligned contact hole is performed, the contact hole having a larger diameter is formed with a conductive side wall. The self-aligned contact hole is filled with the conductive layer, whereas the contact hole having the larger diameter exposes the layer under the side wall. Therefore, by using the side wall as a mask, the underlying layer can be etched and a contact hole reaching a wiring layer 5a can be formed. The following description is related to embodiments capable of forming a contact hole to a gate electrode or wiring layer without using a conductive side wall.

13th Embodiment

Figure 18A:
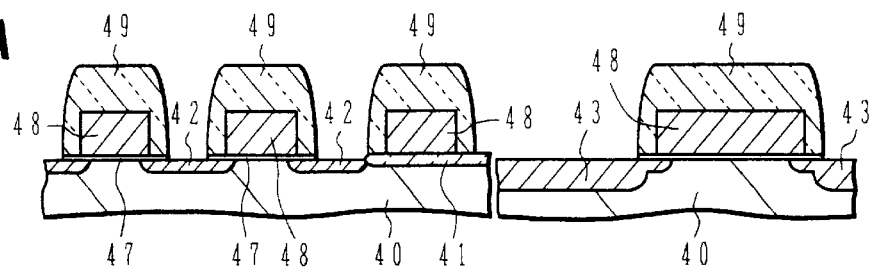
FIGS. 18A to 18D are cross sectional views of a semiconductor device in main manufacture processes illustrating the thirteenth embodiment of the invention.

As shown in FIG. 18A, a field oxide film 41 is selectively formed on the surface of a p-type silicon substrate 40 to define an active region. A gate oxide film 47 is formed on the surface of the active region by thermal oxidation. This thermal oxidation is performed, for example, at a temperature of 800 to 900° C. in a dry or wet atmosphere to form a thermally oxidized film about 5 to 15 nm thick for example.

After the gate oxide film is formed, a gate electrode layer 48 is formed on the gate oxide film. For example, the gate electrode layer is a lamination of a polysilicon layer of 50 nm to 100 nm thick doped with P to $1 \times 10^{31}/cm^3$ and a tungsten silicide (WSi) layer of 50 to 100 nm thick. The polysilicon layer may be formed by CVD at a substrate temperature of 400 to 600° C. by using $SiH_{4b}$, or $Si_2H_6$ and $PH_3$, as source gas. The WSi layer may be formed by CVD at a substrate temperature of 300 to 700° C. by using $SiH_4$ and $WF_6$ as source gas.

The polysilicon layer may be replaced by an amorphous silicon layer. Instead of a polycide layer of silicon and WSi, another polycide layer or a single silicon layer may be used as the gate electrode layer. Instead of CVD, sputtering may be used for the formation of a gate electrode layer.

On the gate electrode layer, a silicon nitride film 49 is deposited 50 nm to 200 nm thick. For example, the silicon nitride film is formed by CVD at a substrate temperature of 600 to 800° C. by using $SiH_4$ and $NH_3$ as source gas.

After a photoresist pattern is formed on the silicon nitride film 49, the silicon nitride film 49 and gate electrode layer 48 are patterned in the same shape. For example, the silicon nitride film 49 is patterned using F containing etchant and the gate electrode layer 48 is patterned by using Cl containing etchant.

After the patterning, the photoresist pattern is removed. After patterning the gate electrode structure, n-type impurity ions are implanted at a low impurity concentration to form low impurity concentration n-type regions 42.

Over the patterned gate electrode structure, a silicon nitride film is again laminated to a thickness of about 50 nm to 150 nm. This laminated silicon nitride film is anisotropically etched through reactive ion etching (RIE) by using F containing etchant to leave side spacers only on the side walls of the gate electrode structure. The silicon nitride film previously formed on the top of the gate electrode layer 48 and the silicon nitride film as the side spacers are indicated as a single silicon nitride film 49.

After the side spacers are formed, the memory cell portion MC is covered with a mask and n-type impurity ions are implanted at a high impurity concentration to form a high impurity concentration region 43. In the peripheral circuit portion PC, a transistor of a lightly doped drain (LDD) structure is formed, and in the memory cell portion MC, a transistor having only low impurity concentration source/drain regions is formed.

Figure 18B:
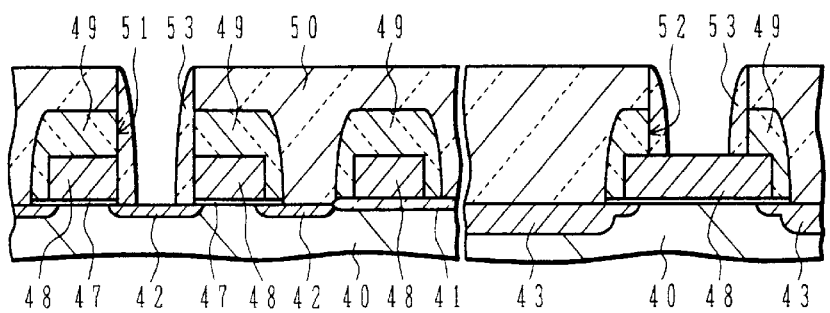

As shown in FIG. 18B, a silicon oxide film 50 is deposited over the substrate whole surface, covering the silicon nitride film 49 which covers the top and side walls of the gate electrode structure 48. The silicon oxide film 50 may be a lamination of a high temperature CVD oxide film of about 30 to 100 nm thick and a BPSG oxide film of about 100 to 300 nm. The CVD oxide film may be formed at a substrate temperature of 700 to 900° C. by using $SiH_4$ and oxidant as source gas.

If the BPSG layer is used as at least an upper layer of the oxide film 50, a reflow process is performed at a temperature of 800 to 1000° C. to planarize the surface of the BPSG layer. Instead of the reflow process, CMP may be used as a planarization process.

A photoresist mask is formed on the oxide film 50 to form a bit contact opening 51 in the memory cell portion and a gate contact opening 52 in the peripheral circuit portion through etching. This etching selection ratio is set large relative to the oxide film and nitride film and small relative to the silicon layer and WSi layer. For example, dry etching using F containing etchant is performed.

The bit line contact hole 51 is formed at the position determined by the opening of the photoresist pattern and between a pair of gate electrode structures 48. The silicon nitride film on the side walls of the gate electrode 48 is partially or wholly removed.

After the contact holes 51 and 52 are formed, the resist mask is removed and a silicon oxide film 53 is deposited, for example, 30 nm to 300 nm over the substrate whole surface. For example, this silicon oxide film 53 is a high temperature oxidation (HTO) film formed by CVD using $SiH_4$ and oxidant as source gas.

After the silicon oxide film 53 is deposited, anisotropic etching is performed by using F containing etchant to remove the silicon oxide film 53 on the flat surface and leave side spacers 53 on the side walls of the contact holes 51 and 52.

In the bit contact hole 51, although the silicon nitride film 49 is removed, the HTO film 53 is formed thereafter as the side spacers so that electrical insulation of the gate electrode 48 is ensured.

Figure 18C:
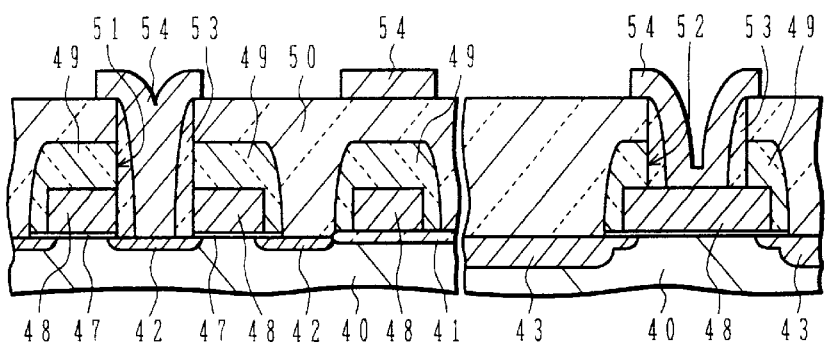

As shown in FIG. 18C, a wiring layer is formed over the substrate whole surface and patterned to form a wiring pattern 54. This wiring pattern 54 may be a polycide structure similar to the gate electrode 48. The wiring pattern 54 formed in the bit contact hole 51 serves as a bit line. The wiring layer 54 may be completely filled in the bit contact hole. In FIG. 18C, if the right bit line 54 and the left bit line 54 are connected, the right side transistor becomes a sense amplifier transistor.

Figure 18D:
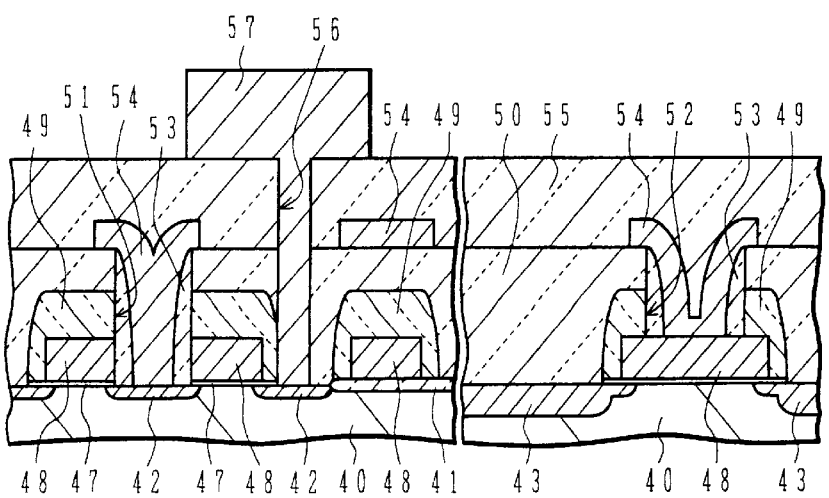

As shown in FIG. 18D, an oxide film 55 is formed covering the wiring pattern 54. The oxide film 55 may be a lamination of an HTO oxide film and a BPSG film similar to the oxide film 50. If the BPSG film is used, it is preferable to planarize the deposited oxide film by reflow or CMP.

A resist mask is formed on the surface of the oxide film 55 to form a capacitor electrode contact hole 56 through the oxide films 55 and 50. This etching of the silicon oxide films is performed at a large etching selection ratio relative to the nitride film.

For example, etchant of a mixed gas of $C_4F_8/Ar/CO/O_2$ is used. With a large etching selection ratio, etching of the contact hole 56 is regulated by the silicon nitride film 49 on the side walls of the gate electrode so that the position of the contact hole is determined by the silicon nitride film in a self-aligned manner.

Since the capacitor electrode contact hole 56 is formed by a single etching process, damages of the silicon substrate exposed on the bottom of the contact hole 56 can be reduced.

Thereafter, a polysilicon layer is deposited over the substrate whole surface and patterned to form a capacitor electrode 57. A capacitor dielectric film is formed on the capacitor electrode 57 and an opposing electrode of silicon film or the like is formed to complete a memory cell capacitor.

The processes of forming an interlayer insulating film and a wiring layer are performed as necessary to complete a semiconductor storage device.

In this embodiment, the contact hole to the substrate and the contact hole to the gate electrode can be formed at a small etching selection ratio relative to other insulating films, whereas the capacitor contact hole can be formed at a large etching selection ratio relative to another insulating film in a self-aligned manner.

The transistor characteristics may be deteriorated by the gate electrode covered with the silicon nitride film. In order to obtain stable transistor characteristics, it is preferable to cover the gate electrode with an oxide film.

14th Embodiment

Figure 19A:
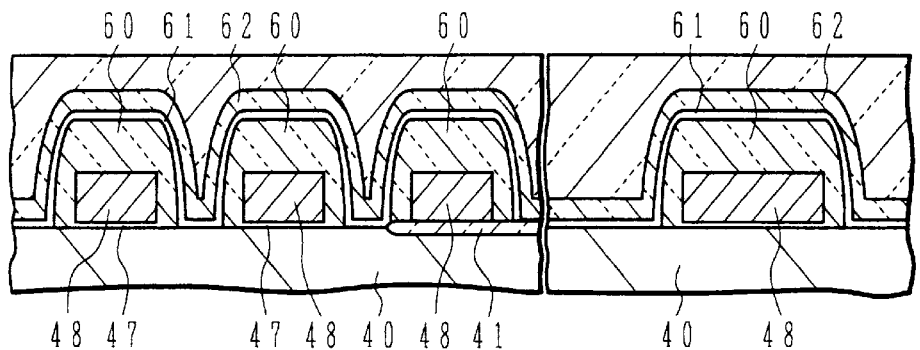
FIGS. 19A to 19C are cross sectional views of a semiconductor device in main manufacture processes illustrating the fourteenth embodiment of the invention.

As shown in FIG. 19A, similar to the thirteenth embodiment, a field oxide film 41 is selectively formed on the surface of a p-type silicon substrate 40 to define an active region. A gate oxide film 47 is formed on the surface of the active region, and a gate electrode layer 48 is formed on the gate oxide film 47. The processes up to this are the same as the thirteenth embodiment. On the gate electrode layer 48, an HTO oxide film 60 is formed about 50 to 200 nm thick by CVD at a substrate temperature of 700 to 900° C. The oxide film 60 and gate electrode layer 48 are etched and patterned by using a resist mask.

After the resist mask is removed, an HTO film is again deposited about 50 to 150 nm over the substrate whole surface and anisotropically etched through RIE to leave side spacers only on the side walls of the gate electrode structure. The side spacers made of the silicon oxide film and the previously formed silicon oxide film are shown as a single silicon oxide film 60.

After the side spacers are formed by RIE, an HTO film 61 is again deposited 10 to 50 nm over the substrate whole surface. On the silicon oxide film 61, a silicon nitride film 62 is deposited 30 to 100 nm thick by CVD. The silicon oxide film 61 and silicon nitride film 62 are both formed conformal to the underlying layer topology. On the silicon nitride film 62, an oxide film 63 is formed. This oxide film 63 may be a lamination of an HTO film and a BPSG film formed by CVD, similar to the oxide film 50 of the thirteenth embodiment. The surface of the oxide film 63 is preferably planarized.

Figure 19B:
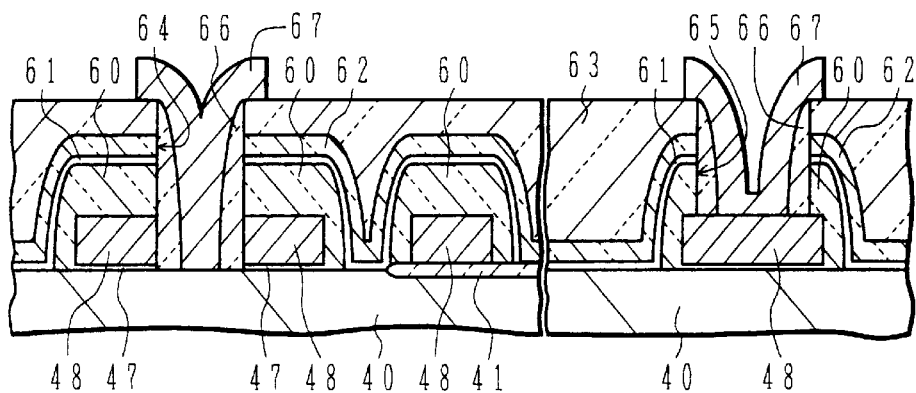

As shown in FIG. 19B, a photoresist mask is formed on the oxide film 63 to form a bit contact opening 64 in the memory cell portion and a gate contact opening 65 in the peripheral circuit portion through etching at a small selection ratio relative to the oxide film and nitride film. For example, dry etching using F containing etchant is performed similar to the thirteenth embodiment.

After the contact holes 64 and 65 are formed, the resist mask is removed and an HTO film 66 is deposited 30 to 100 nm by CVD over the substrate whole surface. The HTO film 66 is anisotropically etched by RIE to leave spacers only on the side walls of the contact holes 64 and 65. These etching and spacer forming processes are basically the same as the thirteenth embodiment. The insulation of the side walls of the gate electrode 59 is ensured by the spacers 66.

After the spacers 66 are formed, wiring patterns 67 filled in the contact holes are formed by a polycide film or the like similar to the thirteenth embodiment.

Figure 19C:
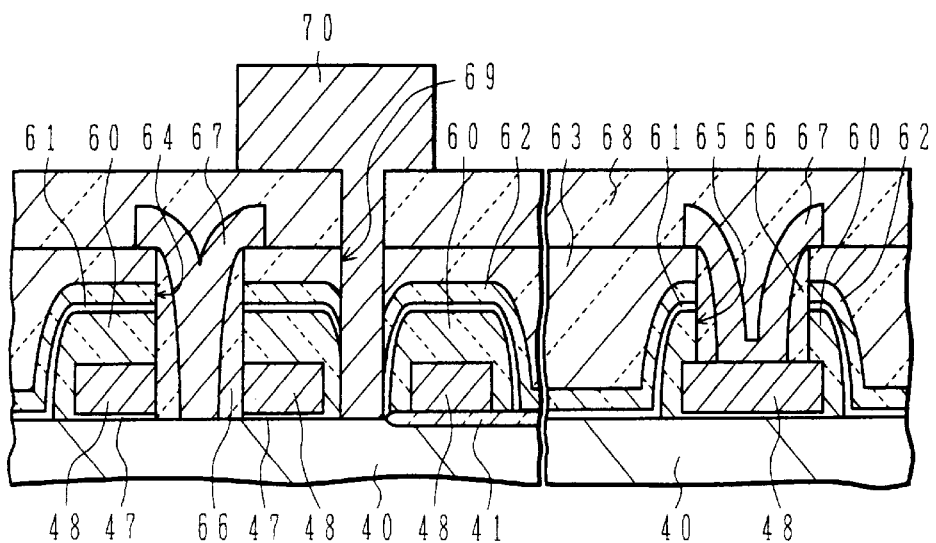

As shown in FIG. 19C, an oxide film 68 is formed over the substrate whole surface, covering the wiring patterns 67. Similar to the oxide film 55 of the thirteenth embodiment, the oxide film 68 may be a lamination of an HTO film and a BPSG film formed by CVD. The surface of the deposited oxide film 68 is preferably planarized by reflow, CMP or the like.

A resist mask is formed on the surface of the oxide film 68 to form a capacitor electrode contact hole 69. This etching for the contact hole 69 is first performed to etch the oxide films 68 and 63 at a large selection ratio relative to the nitride film. For example, dry etching may be performed by using etchant of a mixed gas of $C_4F_8/Ar/CO/O_2$.

When this first etching is completed, the nitride film 62 becomes exposed at the bottom of the contact hole. Next, this nitride film is etched at a large etching selection ratio relative to the oxide film. For example, dry etching may be performed by using etchant gas of $CHF_3/O_2$. When this second etching is completed, the oxide film 61 becomes exposed at the bottom of the contact hole. This oxide film 61 exposed at the bottom of the contact hole is etched and removed to expose the surface of the substrate. After the contact hole 69 is completed, a polysilicon layer is deposited over the substrate whole surface and patterned to form a capacitor electrode 70. A memory cell capacitor is formed by depositing a capacitor dielectric film and an opposing electrode. The processes of forming an interlayer insulating film and a wiring layer are performed as necessary to complete a semiconductor storage device.

In this embodiment, similar to the thirteenth embodiment, the bit line contact hole and the contact hole to the gate electrode in the peripheral circuit portion can be formed at the same time. The capacitor contact hole can be formed by a single self-aligned etching process. Since the gate electrode is not in direct contact with the nitride film, the transistor characteristics can be easily stabilized.

15th Embodiment

Figure 20A:
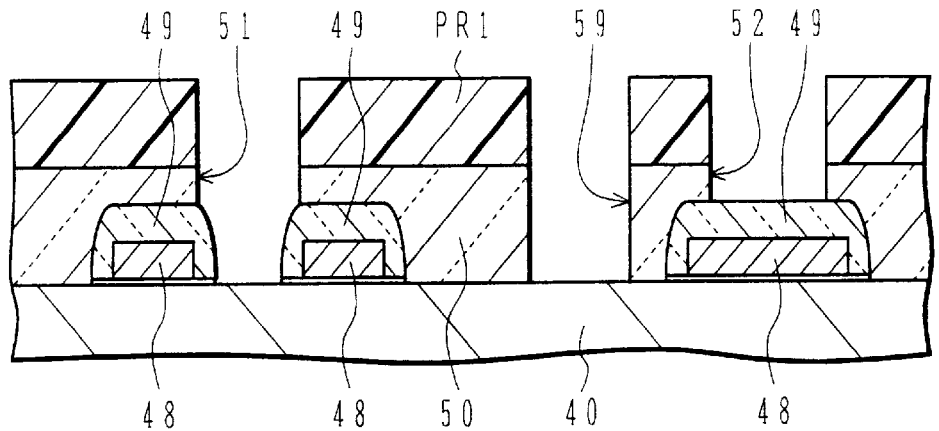
FIGS. 20A to 20C are cross sectional views of a semiconductor device in main manufacture processes illustrating the fifteenth embodiment of the invention.

As shown in FIG. 20A, similar to the processes of FIG. 18A, a gate electrode 48 and a silicon nitride film 49 are formed on the surface of a p-type silicon substrate 40, and an oxide film 50 is deposited over the substrate whole surface. A resist mask PR1 is formed on the oxide film 50 to etch the oxide film at a large etching selection ratio relative to the nitride film to form contact holes 51, 52 and 59. The contact holes 51 and 59 expose the substrate surface only by the etching of the oxide film, whereas the etching of the contact hole 52 stops at the nitride film 49.

If the nitride film 49 is etched under these conditions, damages of the exposed substrate surface become large.

Figure 20B:
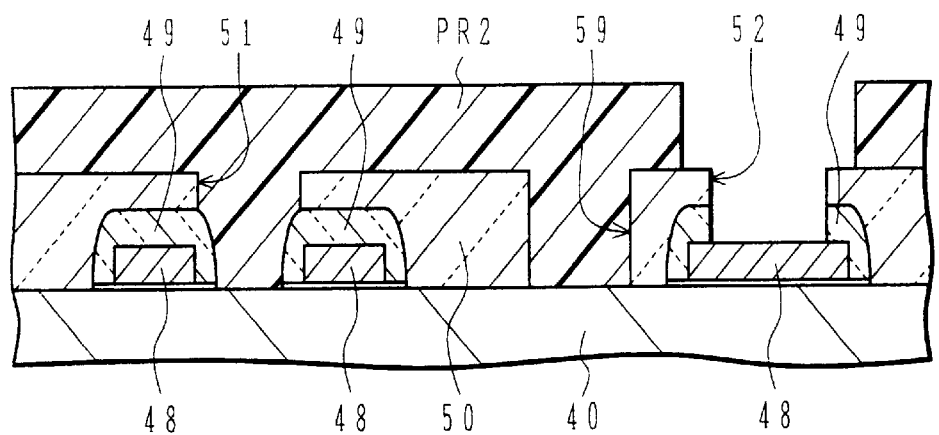

As shown in FIG. 20B, after the resist mask PR1 is removed, another resist mask PR2 is formed. This resist mask is used for covering the contact holes 51 and 59 so that its patterning precision is not strict. The resist mask PR2 exposes the contact hole 52.

By using the resist mask PR2 and oxide film 50 as a mask, the nitride film 49 exposed on the bottom of the contact hole 52 is etched. The nitride film 49 is etched at a large etching selection ratio relative to the oxide film 50 and gate electrode 48. In the above manner, the gate contact hole 52 can be formed by removing the nitride film 49 on the gate electrode 48 without giving any damage to the substrate surface otherwise exposed on the bottoms of the contact holes 51 and 59.

Figure 20C:
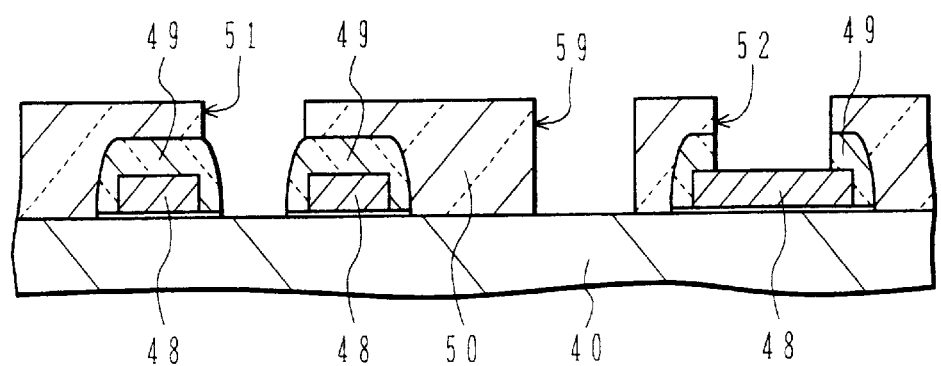

As shown in FIG. 20C, after the contact holes are completed, the resist mask PR2 is removed.

In the above embodiments, although the processes of forming wells are omitted, n-, p-, triple-wells and the like may be formed in the surface layer of the substrate if necessary. It is also possible to form memory cells and memory capacitors of various shapes by using other well known techniques. It is obvious to those skilled in the art to combine the above embodiments as desired.

A DRAM structure and its manufacture method have been described in connection with the first to fifteenth embodiments of the invention. The invention is not limited only to DRAMs but applicable to other semiconductor devices having contact holes to a first level wiring layer and a second level wiring layer to be formed at the same time.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device formed on a semiconductor substrate having a first region and a second region, comprising:
   (a) a first wiring layer made of a first conductive layer formed in the second region of the semiconductor substrate;
   (b) a first insulating film covering said first wiring layer;
   (c) a second insulating film formed over the semiconductor substrate, covering said first insulating film;
   (d) a first contact hole formed through said second insulating film in the first region, said first contact hole having a first diameter and reaching the surface of the semiconductor substrate;
   (e) a second contact hole formed through said second insulating film in the second region, said second contact hole having a second diameter larger than the first diameter and reaching the surface of said first insulating film;
   (f) a first conductive plug made of a second conductive layer filled in said first contact hole;
   (g) a conductive side spacer made of the second conductive layer and formed on a side wall of said second contact hole; and
   (h) a third contact hole formed through said first insulating film positioned under said second contact hole, said third contact hole having a third diameter smaller than the second diameter and reaching said first wiring layer.

2. A semiconductor device according to claim 1, wherein said first and second insulating films have different etching characteristics.

3. A semiconductor device according to claim 1, further comprising a plurality of second wiring layers made of the first conductive layer and formed in the first region, wherein said first insulating film covers said second wiring layers, and said first contact hole is positioned between an adjacent pair of second wiring layers.

4. A semiconductor device according to claim 3, wherein said first contact hole is a contact hole to a bit line of a memory cell and said second contact hole is a contact hole to a gate electrode of a sense amplifier circuit.

5. A semiconductor device according to claim 1, further comprising a third conductive layer formed on said second insulating film, said third conductive layer having substantially the same etching characteristics as said second conductive layer.

6. A semiconductor device according to claim 1, further comprising a second conductive plug formed in said second and third contact holes for electrically connecting said first wiring layer.

7. A semiconductor device according to claim 1, further comprising a fourth contact hole formed through said second insulating film and exposing the surface of the semiconductor substrate, said fourth contact hole having a fourth diameter larger than the first diameter.

8. A semiconductor device formed on a semiconductor substrate having a first region and a second region, comprising:
   (a) a first wiring layer made of a first conductive layer formed in the second region of the semiconductor substrate;
   (b) a first insulating film covering said first wiring layer;
   (c) a second insulating film formed over the semiconductor substrate, covering said first insulating film;
   (d) a first contact hole formed through said second insulating film in the first region, said first contact hole having a first diameter;
   (e) a second contact hole formed through said second insulating film in the second region, said second contact hole having a second diameter larger than the first diameter and reaching the surface of said first insulating film;
   (f) a first conductive plug made of a second conductive layer filled in said first contact hole;
   (g) a conductive side spacer made of the second conductive layer and formed on a side wall of said second contact hole; and
   (h) a third contact hole formed through said first insulating film positioned under said second contact hole, said third contact hole having a third diameter smaller than the second diameter and reaching said first wiring layer.

9. A semiconductor device according to claim 8, wherein said first and second insulating films have different etching characteristics.

10. A semiconductor device according to claim 8, further comprising a plurality of second wiring layers made of the first conductive layer and formed in the first region, wherein said first insulating covers said second wiring layers, and said first contact hole is positioned between an adjacent pair of second wiring layers.

11. A semiconductor device according to claim 10, wherein said first contact hole is a contact hole to a bit line of a memory cell and said second contact hole is a contact hole to a gate electrode of a sense amplifier circuit.

12. A semiconductor device according to claim 8, further comprising a third conductive layer formed on said second insulating film, said third conductive layer having substantially the same etching characteristics as said second conductive layer.

13. A semiconductor device according to claim 8, further comprising a second conductive plug formed in said second and third contact holes for electrically connecting said first wiring layer.

14. A semiconductor device according to claim 8, further comprising a fourth contact hole formed through said second insulating film and exposing the surface of the semiconductor substrate, said fourth contact hole having a fourth diameter larger than the first diameter.

* * * * *